United States Patent
Chujo et al.

(10) Patent No.: US 9,136,214 B2
(45) Date of Patent: Sep. 15, 2015

(54) METHOD FOR MANUFACTURING MULTILAYER WIRING BOARD

(75) Inventors: Shigeki Chujo, Yashio (JP); Koichi Nakayama, Matsudo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 1464 days.

(21) Appl. No.: 12/691,226

(22) Filed: Jan. 21, 2010

(65) Prior Publication Data
US 2010/0116782 A1     May 13, 2010

Related U.S. Application Data

(62) Division of application No. 11/791,572, filed as application No. PCT/JP2005/020822 on Nov. 14, 2005, now Pat. No. 7,800,002.

(30) Foreign Application Priority Data

Nov. 24, 2004  (JP) .................................. 2004-338490

(51) Int. Cl.
  *H05K 3/30*      (2006.01)
  *H01L 23/498*   (2006.01)
  (Continued)

(52) U.S. Cl.
  CPC ........ *H01L 23/49827* (2013.01); *H01L 21/486* (2013.01); *H05K 3/445* (2013.01);
  (Continued)

(58) Field of Classification Search
  USPC ........................... 29/593, 832, 854; 73/865.4;
                340/426.35, 426.36, 426.1, 425.5, 505
  See application file for complete search history.

(56) References Cited

U.S. PATENT DOCUMENTS

| 6,178,082 B1 | 1/2001 | Farooq et al. |
| 6,221,769 B1 | 4/2001 | Dhong et al. |

(Continued)

FOREIGN PATENT DOCUMENTS

| CN | 1335899 | 2/2002 |
| EP | 114649 | 10/2001 |

(Continued)

OTHER PUBLICATIONS

Extended European Search Report issued Mar. 30, 2010 to corresponding European Patent Application No. 05806323.1.

(Continued)

*Primary Examiner* — Paul D Kim
(74) *Attorney, Agent, or Firm* — Harness, Dickey & Pierce, PLC

(57) ABSTRACT

A multilayer wiring board has a high degree of freedom of wiring design and can realize high-density wiring, and a method to simply manufacture the multilayer wiring board. A core substrate with two or more wiring layers provided thereon through an electrical insulating layer. The core substrate has a plurality of throughholes filled with an electroconductive material, and the front side and back side of the core substrate have been electrically conducted to each other by the electroconductive material. The throughholes have an opening diameter in the range of 10 to 100 μm. An insulation layer and an electroconductive material diffusion barrier layer are also provided, and the electroconductive material is filled into the throughholes through the insulation layer. A first wiring layer provided through an electrical insulating layer on the core substrate is connected to the electroconductive material filled into the throughhole through via.

8 Claims, 9 Drawing Sheets

(51) Int. Cl.
  *H01L 21/48* (2006.01)
  *H05K 3/44* (2006.01)
  *H05K 3/46* (2006.01)
  *H01L 21/683* (2006.01)
  *H05K 1/03* (2006.01)
  *H05K 3/38* (2006.01)
  *H05K 3/42* (2006.01)

(52) U.S. Cl.
  CPC ......... *H05K 3/4605* (2013.01); *H01L 21/6835* (2013.01); *H01L 2924/0002* (2013.01); *H05K 1/0306* (2013.01); *H05K 3/388* (2013.01); *H05K 3/423* (2013.01); *H05K 2201/096* (2013.01); *H05K 2201/09563* (2013.01)

(56) References Cited

U.S. PATENT DOCUMENTS

| | | |
|---|---|---|
| 6,248,958 B1 | 6/2001 | McClure et al. |
| 6,625,032 B1 | 9/2003 | Ito et al. |
| 7,030,481 B2 | 4/2006 | Chudzik et al. |
| 7,365,272 B2 | 4/2008 | Hsu et al. |
| 7,690,109 B2 * | 4/2010 | Mori et al. ............... 29/852 |
| 8,445,995 B2 * | 5/2013 | Lin et al. ............... 257/622 |
| 2003/0038344 A1 | 2/2003 | Palmer et al. |
| 2003/0086248 A1 | 5/2003 | Mashino |
| 2005/0150683 A1 | 7/2005 | Farnworth et al. |

FOREIGN PATENT DOCUMENTS

| | | |
|---|---|---|
| GB | 2401485 | 11/2004 |
| JP | 09-130050 | 5/1997 |
| JP | 2003-023251 | 1/2003 |
| JP | 2004-047667 | 2/2004 |
| JP | 2004-119698 | 4/2004 |

OTHER PUBLICATIONS

Chinese Office Action dated Mar. 6, 2009, including partial English translation.

Lu Dacheng, "The New Generation of Semiconductor Wiring Material", Chinese Journal of Rare Metals, vol. 17, p. 308, Rare Metal News, 1992 (1664), 5; including English Translation.

* cited by examiner

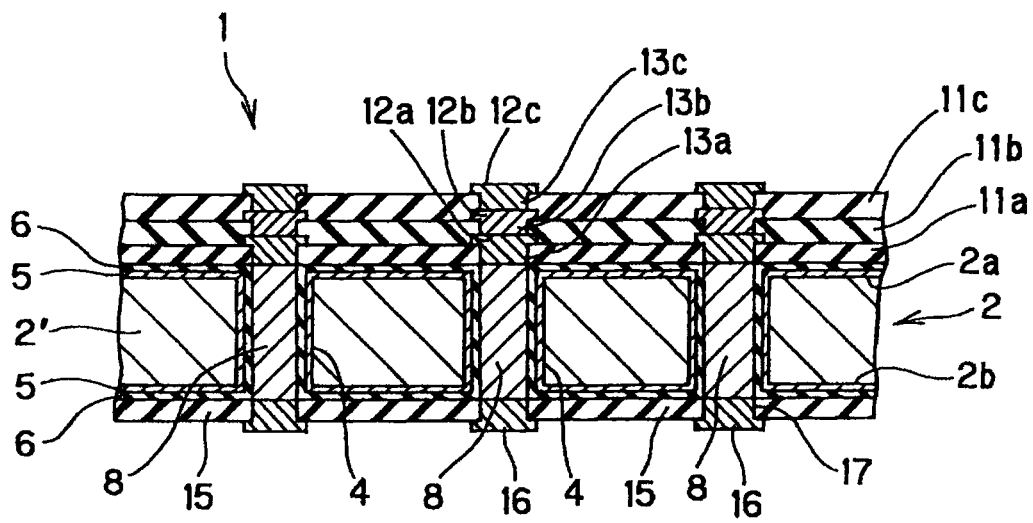
F I G. 1
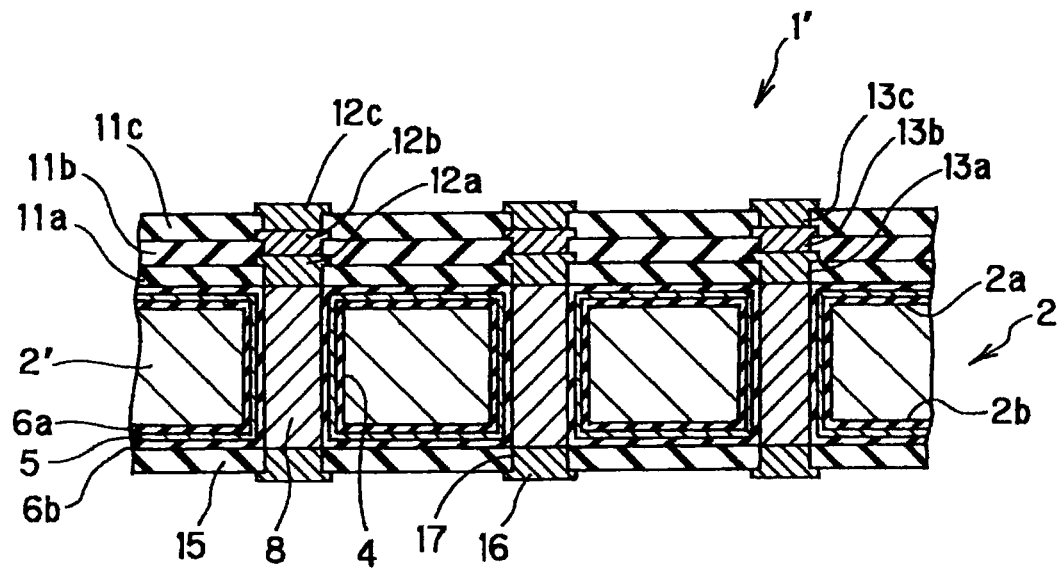
F I G. 2

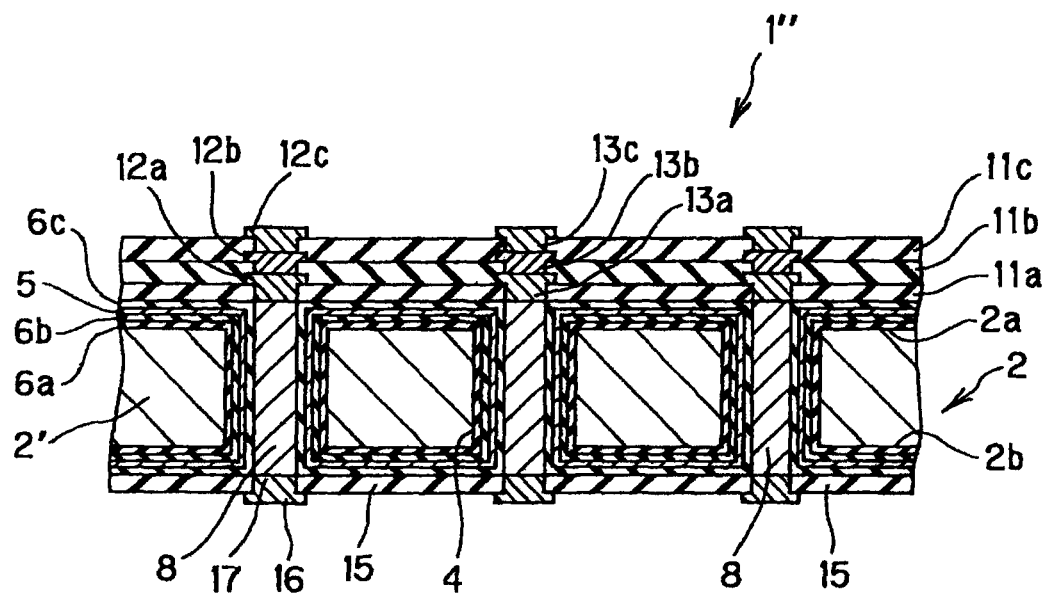
F I G. 3
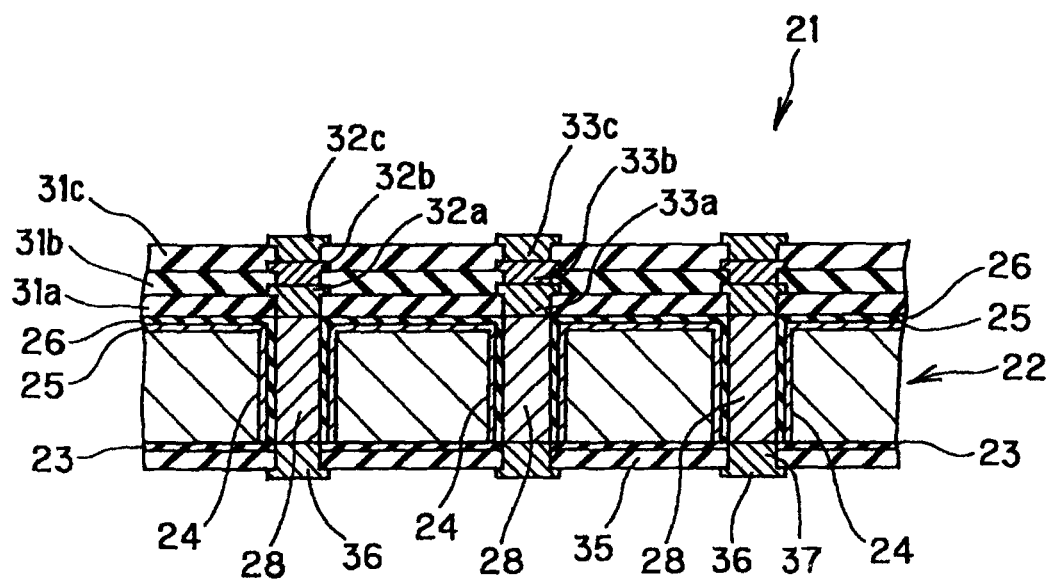
F I G. 4

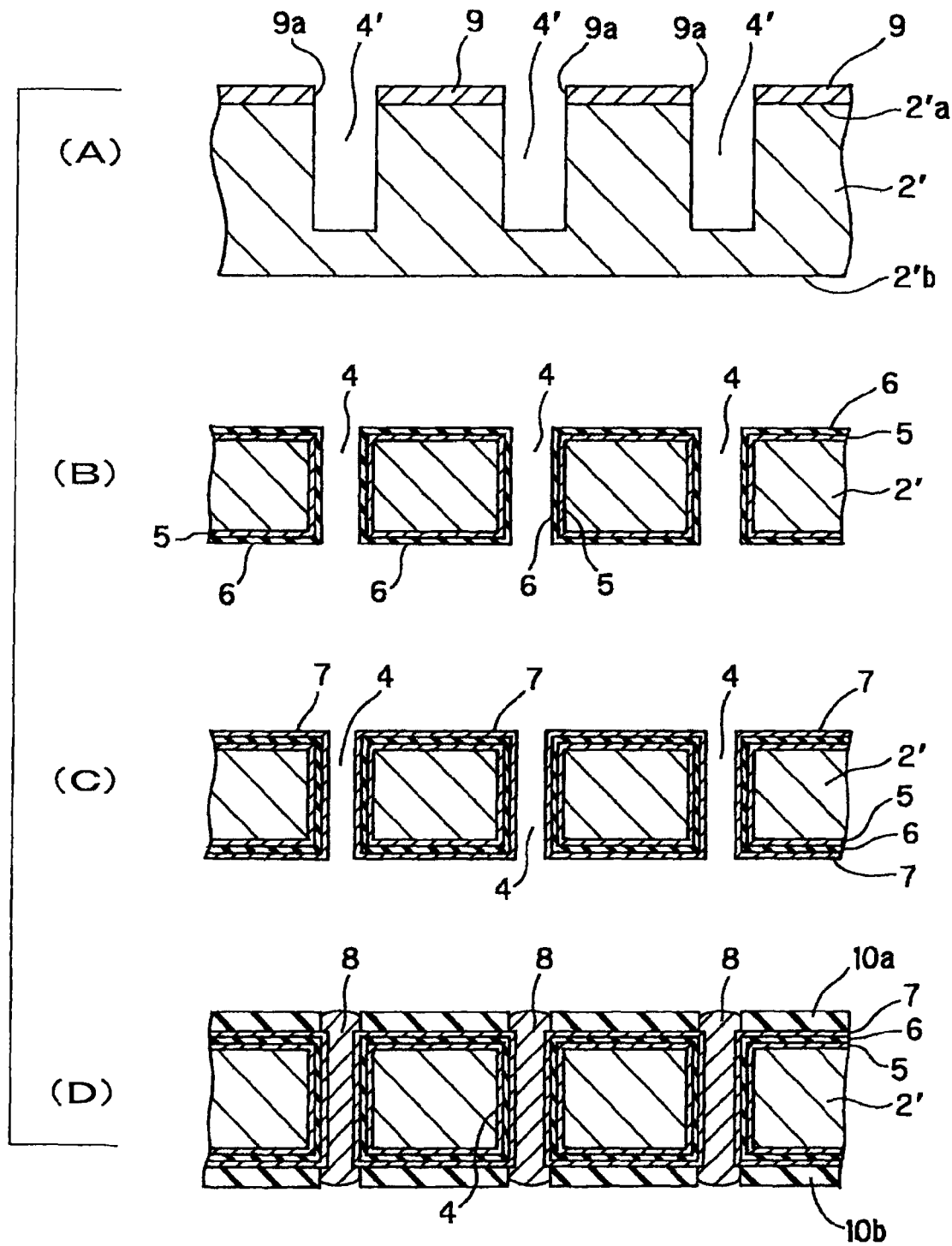
F I G. 5

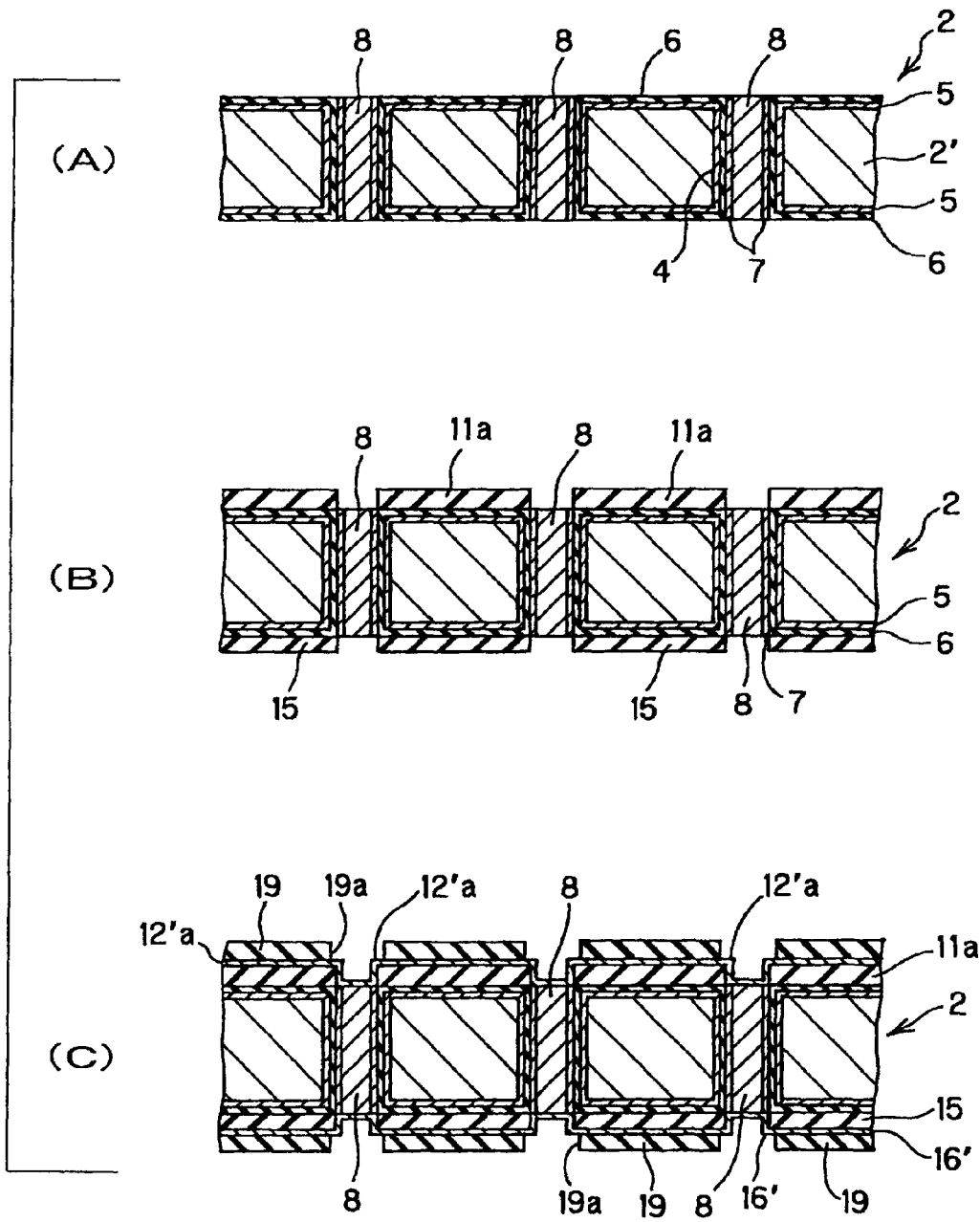
F I G. 6

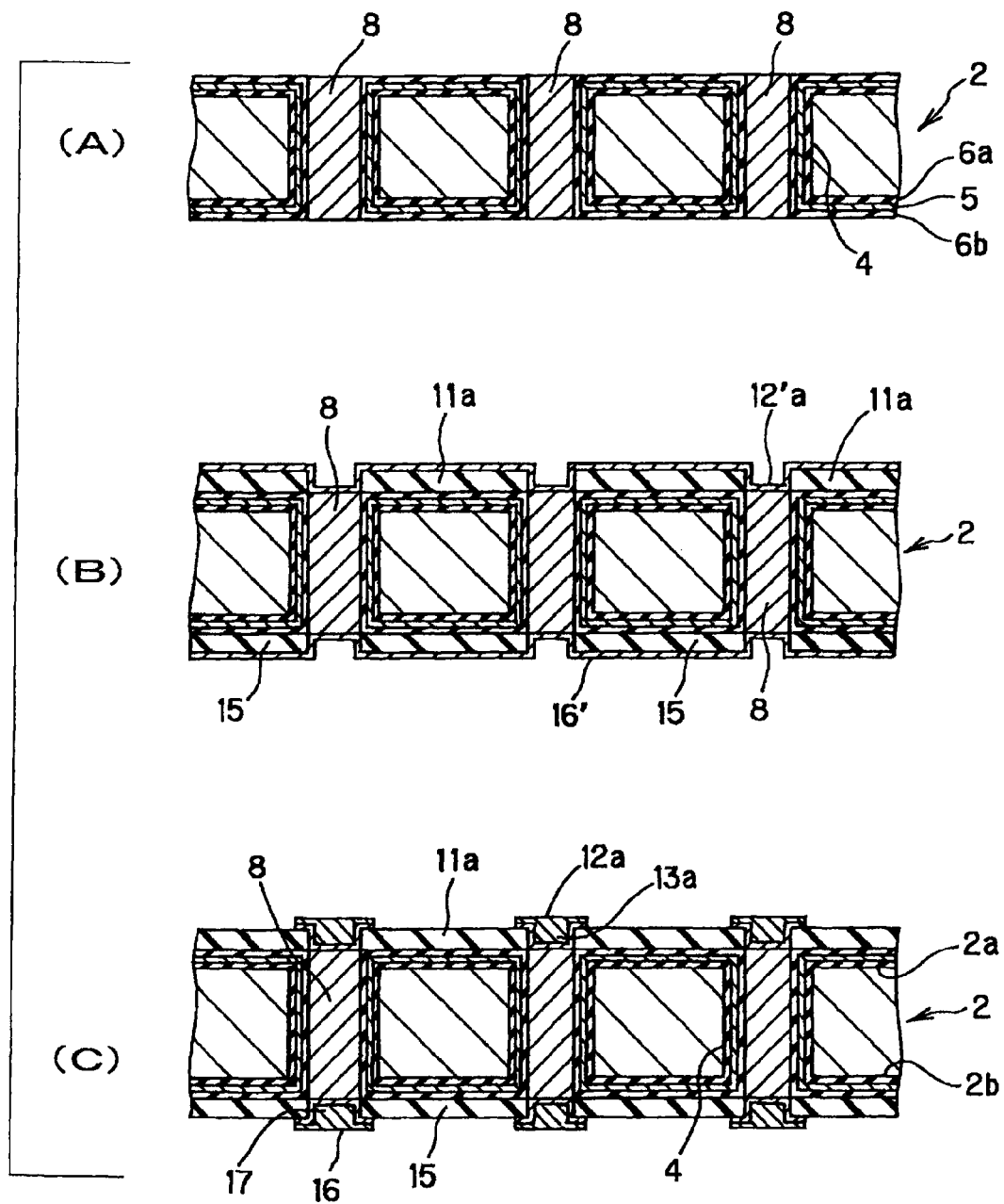
F I G. 9

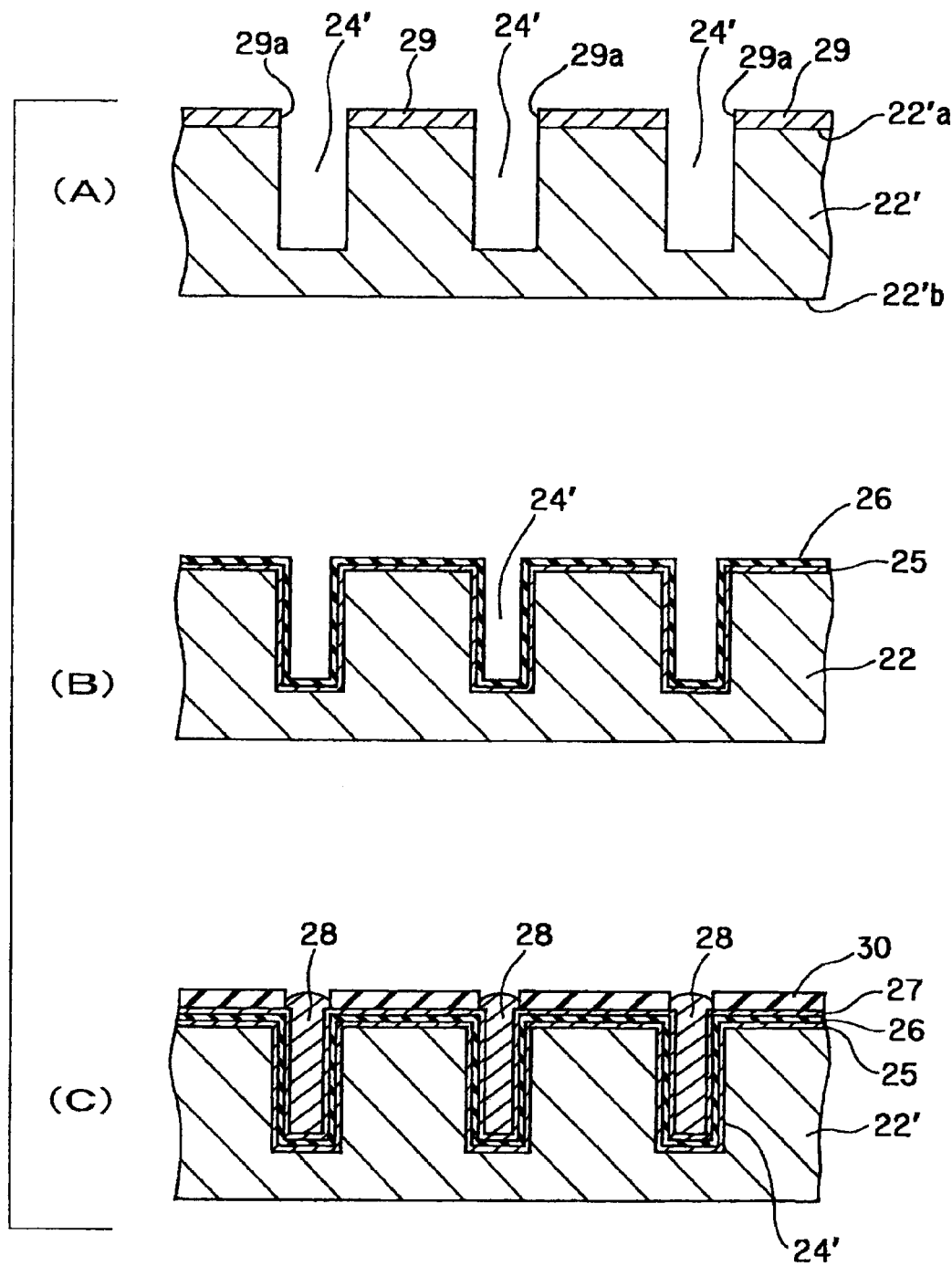
F I G. 10

METHOD FOR MANUFACTURING MULTILAYER WIRING BOARD

CROSS REFERENCE TO RELATED APPLICATIONS

This application claims the benefit of U.S. application Ser. No. 11/791,572, filed May 24, 2007, now U.S. Pat. No. 7,800,002, which is the U.S. National Phase filing of Application No. PCT/JP2005/020822 filed Nov. 14, 2005, and of Japanese Application No. 2004-338490 filed Nov. 24, 2004, the disclosures of each of the above applications are incorporated herein by reference in their entirety.

BACKGROUND OF THE INVENTION

1. Field of Invention

The present invention relates to a multilayer wiring board and a method for manufacturing the same. More particularly, the present invention relates to a multilayer wiring board comprising high-density wiring for semiconductor chip mounting and a method for manufacturing the multilayer wiring board.

2. Background Art

In recent years, an advance of an enhancement in performance, a size reduction and a weight reduction of electronic equipment has led to a demand for a size reduction, multipin design, and fine pitches of external terminals in semiconductor packages. Accordingly, there is an ever-increasing demand for higher-density wiring boards. To meet this demand, mounting of LSIs directly on printing wiring boards or mounting of CSPs (chip size packages) and BGAs (ball grid arrays) on printed wiring boards has become adopted. Regarding printed wiring boards as well, to cope with a demand for higher density, multilayer wiring boards manufactured by a buildup method, in which wiring and via are built up one layer by one layer onto a core substrate through an electrical insulating layer to form a multilayer structure, have become used.

In conventional buildup multilayer wiring boards, a core substrate formed by drilling throughholes in an insulating substrate and plating the inner side of the throughholes with a metal, and filling a resin or an electroconductive paste into the throughholes has been used (Japanese Patent Laid-Open No. 130050/1997). In this core substrate, the front and back sides are electrically conducted to each other through the throughholes, and wiring is built up through an electrical insulating layer onto this core substrate to form a multilayer structure and thus to form a multilayer wiring board. Further, in recent years, a multilayer wiring board having a laminated structure has been developed. This multilayer wiring board has been formed by subjecting resin-filled throughholes to lid plating to form a plating layer so as to clog the opening part in the throughholes, disposing vias immediately above the lid plated parts, and further disposing vias on the vias (Japanese Patent Laid-Open No. 23251/2003).

[Patent document 1] Japanese Patent Laid-Open No. 130050/1997

[Patent document 2] Japanese Patent Laid-Open No. 23251/2003

DISCLOSURE OF THE INVENTION

Problems to be Solved by the Invention

Since, however, the formation of the throughholes by the conventional technique is carried out by drilling, throughholes having a smaller opening diameter than the drill diameter cannot be formed. Drilling using a fine drill to overcome this problem resulted in an increased frequency of breakage of the drill. This poses a problem that the formation of fine throughholes is so difficult that the degree of freedom of wiring design is limited.

Further, the structure in which the resin-filled throughholes have been subjected to lid plating is also disadvantageous in that the resin filled into the throughholes is stretched or shrunk due to thermal shrinkage or thermal expansion of an insulating substrate used and, consequently, stress is likely to concentrate on the vias formed on the lid-plated part, resulting in lowered connection reliability Under such circumstances, the present invention has been made, and an object of the present invention is to provide a multilayer wiring board, which has a high degree of freedom of wiring design and can realize high-density wiring, and a method which can simply manufacture the multilayer wiring board.

Means for Solving the Problems

The above object can be attained by a multilayer wiring board comprising: a core substrate; and two or more wiring layers provided through an electrical insulating layer on the core substrate, wherein the core substrate has a plurality of throughholes filled with an electroconductive material for electrical conduction between the front side and back side of the core substrate, the throughholes have an opening diameter in the range of 10 to 100 μm, an insulation layer and an electroconductive material diffusion barrier layer are provided on the inner wall surface of the throughholes, the electroconductive material has been filled into the throughholes through the insulation layer, and a first wiring layer is provided on the core substrate through an electrical insulating layer and is connected to the electroconductive material within the throughhole through a via.

In a preferred embodiment of the present invention, the electroconductive material diffusion barrier layer is a thin film of titanium nitride.

In a preferred embodiment of the present invention, the insulation layer is a thin film of silicon dioxide.

In a preferred embodiment of the present invention, the insulation layer and the electroconductive material diffusion barrier layer are stacked on the inner wall surface within the throughholes in the order of the electroconductive material diffusion barrier layer and the insulation layer.

In a preferred embodiment of the present invention, the insulation layer comprises a first insulation layer and a second insulation layer, and the insulation layer and the electroconductive material diffusion barrier layer are stacked on the inner wall surface within the throughholes in the order of the first insulation layer, the electroconductive material diffusion barrier layer, and the second insulation layer.

In a preferred embodiment of the present invention, the first insulation layer and the second insulation layer are formed of an identical material.

In a preferred embodiment of the present invention, the insulation layer further comprises a third insulation layer in addition to the first and second insulation layers, the insulation layer and the electroconductive material diffusion barrier layer are stacked on the inner wall surface within the throughholes in the order of the first insulation layer, the second insulation layer, the electroconductive material diffusion barrier layer, and the third insulation layer, and the second insulation layer and the third insulation layer have an identical chemical composition.

In a preferred embodiment of the present invention, the electroconductive material is copper provided within the throughholes by electroplating.

In a preferred embodiment of the present invention, the electroconductive material is an electroconductive paste filled into the through holes.

In a preferred embodiment of the present invention, the opening diameter of the throughholes is in the range of 10 to 70 µm.

In a preferred embodiment of the present invention, the thickness of the core substrate is in the range of 50 to 725 µm.

In a preferred embodiment of the present invention, the core substrate is a silicon core substrate.

According to another aspect of the present invention, there is provided a method for manufacturing a multilayer wiring board comprising a core substrate and two or more wiring layers provided through an electrical insulating layer on the core substrate, said method comprising the steps of: boring pores having an opening diameter in the range of 10 to 100 µm from one side of a core material constituting the core substrate by dry etching utilizing plasma to a predetermined depth; forming an insulation layer and an electroconductive material diffusion barrier layer on the surface of the core material including the inner wall surface of the pores so that the electroconductive material diffusion barrier layer is covered with the insulation layer and then forming an electroconductive base layer on the insulation layer at least in its part located on the inner wall surface of the pores; forming a desired resist film on the core material excluding the inside of the pores and filling an electroconductive material into the pores by electroplating using the electroconductive base layer as a seed layer; removing the resist film, polishing the other side of the core material to expose the pores and thus to form throughholes, whereby the core substrate is brought to such a state that the front side and back side of the core substrate have been electrically conducted to each other by the electroconductive material through the throughholes; and forming vias on the core substrate so as to be connected to the electroconductive material filled into the throughholes and, at the same time, forming a first wiring layer through an electrical insulating layer.

In a preferred embodiment of the present invention, the electroconductive base layer is formed by MO-CVD.

According to still another aspect of the present invention, there is provide a method for manufacturing a multilayer wiring board comprising a core substrate and two or more wiring layers provided through an electrical insulating layer on the core substrate, said method comprising the steps of: subjecting a core material for a core substrate to dry etching utilizing plasma from one side of the core material to form pores having an opening diameter in the range of 10 to 100 µm to a predetermined depth; polishing the other side of the core material to expose the pores and thus to form throughholes; forming an insulation layer and an electroconductive material diffusion barrier layer at least on the inner wall surface of the throughholes so that the electroconductive material diffusion barrier layer is covered with the insulation layer; filling an electroconductive material into the throughholes to bring the core substrate to such a state that the front side and back side of the core substrate have been electrically conducted to each other; and forming vias on the core substrate so as to be connected to the electroconductive material filled into the throughholes and, at the same time, forming a first wiring layer through an electrical insulating layer.

In a preferred embodiment of the present invention, in the step of forming the insulation layer and the electroconductive material diffusion barrier layer, after the formation of the insulation layer and the electroconductive material diffusion barrier layer on the surface of the core material including the inner wall surface of the throughholes so that the electroconductive material diffusion barrier layer is covered with the insulation layer, an electroconductive base layer is formed on the insulation layer at least in its part located on the inner wall surface of the throughholes, and, in the step of filling the electroconductive material into the throughholes, a desired resist film is formed on the core material excluding the inside of the throughholes followed by electroplating to fill the electroconductive material into the throughholes.

In a preferred embodiment of the present invention, the electroconductive base layer is formed by MO-CVD.

According to a further aspect of the present invention, there is provided a method for manufacturing a multilayer wiring board comprising a core substrate and two or more wiring layers provided through an electrical insulating layer on the core substrate, said method comprising the steps of: subjecting a core material for a core substrate to dry etching utilizing plasma from one side of the core material to form pores having an opening diameter in the range of 10 to 100 µm to a predetermined depth; polishing the other side of the core material to expose the pores and thus to form throughholes; forming an insulation layer and an electroconductive material diffusion barrier layer on both sides of the core material and the inner wall surface of the throughholes so that the electroconductive material diffusion barrier layer is covered with the insulation layer, and then forming an electroconductive base layer on the whole area of one side of the core material; forming a desired resist film on the electroconductive base layer and on the insulation layer in its site remote from the core material and filling an electroconductive material into the throughholes by electroplating using the electroconductive base layer as a seed layer so that the front side and back side of the core substrate have been electrically conducted to each other; and forming vias on the core substrate so as to be connected to the electroconductive material filled into the throughholes and, at the same time, forming a first wiring layer through an electrical insulating layer.

In a preferred embodiment of the present invention, the electroconductive base layer is formed by either vapor deposition or sputtering.

In a preferred embodiment of the present invention, in the step of forming the insulation layer and the electroconductive material diffusion barrier layer, the insulation layer and the electroconductive material diffusion barrier layer are formed by any one of a method in which the electroconductive material diffusion barrier layer and the insulation layer are stacked in that order, a method in which two insulation layers as the insulation layer and the electroconductive material diffusion barrier layer are formed by stacking a first insulation layer, the electroconductive material diffusion barrier layer, and a second insulation layer in that order, and a method in which three insulation layers as the insulation layer and the electroconductive material diffusion barrier layer are formed by stacking a first insulation layer, a second insulation layer, the electroconductive material diffusion barrier layer, and a third insulation layer in that order, the first insulation layer is formed by thermal oxidation or plasma CVD, and the second insulation layer and the third insulation layer are formed by plasma CVD.

In a preferred embodiment of the present invention, the electroconductive material diffusion barrier layer is formed by MO-CVD. In a preferred embodiment of the present invention, the pores are formed so as to have an opening diameter in the range of 10 to 70 µm.

In a preferred embodiment of the present invention, the core material is silicon.

Effect of the Invention

As described above in detail, according to the present invention, the throughholes have an opening diameter in the range of 10 to 100 μm and can be formed at narrow pitches and, at the same time, can easily ensure the space among the throughholes. Necessary wiring can be formed in this space, and, thus, desired high-density wiring can be formed in a smaller number of layers, whereby the manufacture of a thin-shaped semiconductor device can be realized. Further, by virtue of a structure in which an electroconductive material has been filled into the throughholes and a first wiring layer has been formed through vias connected to the electroconductive material, that is, a structure comprising vias immediately above the throughholes, a high degree of freedom of multilayer wiring design can be realized. Furthermore, the electroconductive material diffusion barrier layer provided on the inner wall surface of the throughholes can prevent the diffusion of the electroconductive material, filled into the throughholes, into the core substrate, and the insulation layer located between the electroconductive material and the electroconductive material diffusion barrier layer can prevent a change in electrical conductivity of the electroconductive material diffusion barrier layer caused by the diffusion of the electroconductive material, whereby the electroconductive material diffusion barrier layer can develop designed electrical characteristics. Therefore, the electroconductive material diffusion preventive effect can be enhanced, and, even in the provision of throughholes at narrower pitches, shortcircuiting between adjacent throughholes can be prevented. Further, since any resin is not filled into the throughholes, stress concentration, on vias provided immediately above the throughholes, caused by thermal shrinkage and thermal expansion of the core substrate is less likely to occur and, thus, highly reliable connection can be realized.

Furthermore, in the manufacturing method according to the present invention, since throughholes are formed by dry etching utilizing plasma, throughholes having a small opening diameter can be formed. In addition, by virtue of the construction in which vias are formed immediately above the throughholes and the first wiring layer is connected through the vias to the electroconductive material filled into the throughholes, the degree of freedom of multilayer wiring design can be enhanced. Further, since the electroconductive material diffusion barrier layer is covered with the insulation layer, in filling the electroconductive material into the throughholes using the electroconductive base layer as a seed layer, the adhesion between the insulation layer and the resist film is good and, hence, there is no possibility that the electroconductive material enters the interface of the insulation layer and the resist film resulting in unnecessary spreading of the electroconductive material. Therefore, the electroconductive material can be filled with high accuracy, and the provision of throughholes at narrower pitches and an improvement in yield can be realized.

BRIEF DESCRIPTION OF THE DRAWINGS

FIG. 1 is a partial longitudinal cross-sectional view showing one embodiment of the multilayer wiring board according to the present invention;

FIG. 2 is a partial longitudinal cross-sectional view showing another embodiment of the multilayer wiring board according to the present invention;

FIG. 3 is a partial longitudinal cross-sectional view showing still another embodiment of the multilayer wiring board according to the present invention;

FIG. 4 is a partial longitudinal cross-sectional view showing a further embodiment of the multilayer wiring board according to the present invention;

FIG. 5 is a process diagram showing one embodiment of the method for manufacturing a multilayer wiring board according to the present invention;

FIG. 6 is a process diagram showing one embodiment of the method for manufacturing a multilayer wiring board according to the present invention;

FIG. 9 is a process diagram showing another embodiment of the method for manufacturing a multilayer wiring board according to the present invention;

FIG. 10 is a process diagram showing another embodiment of the method for manufacturing a multilayer wiring board according to the present invention.

BEST MODE FOR CARRYING OUT THE INVENTION

Figure 7:
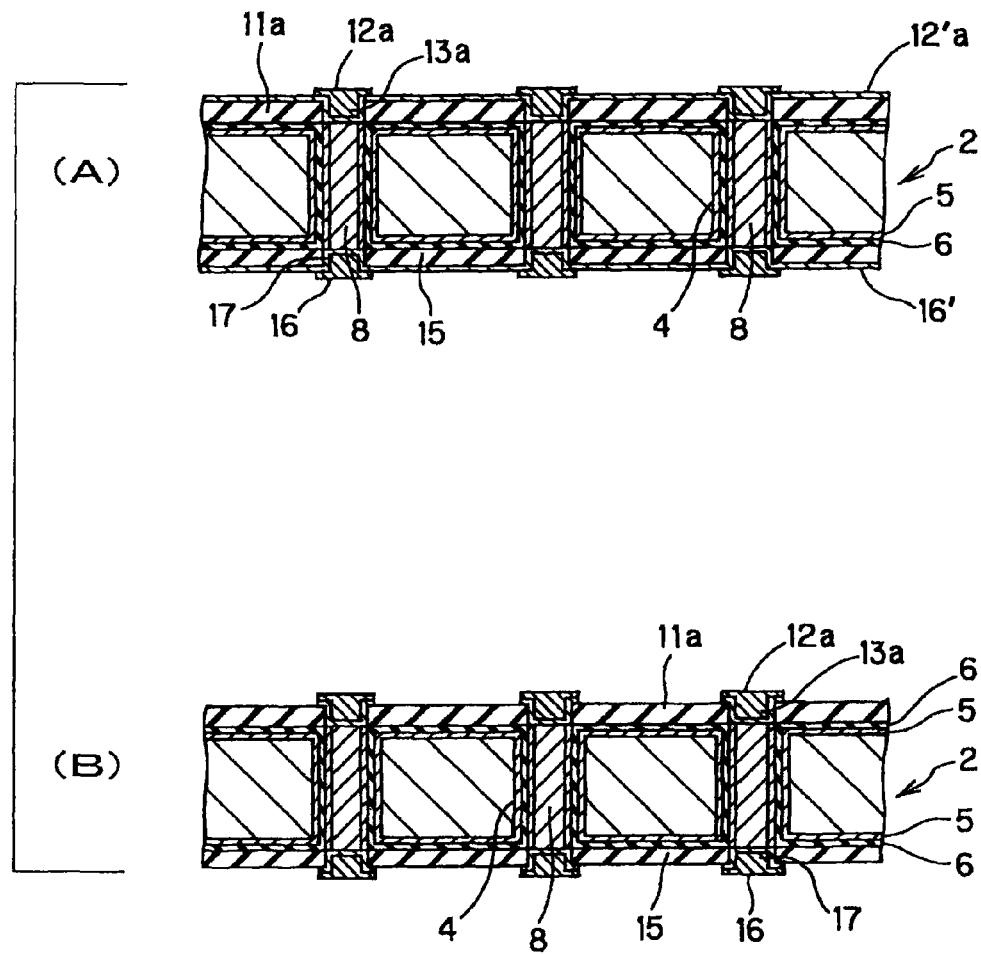
FIG. 7 is a process diagram showing one embodiment of the method for manufacturing a multilayer wiring board according to the present invention.

Embodiments of the present invention will be described with reference to the accompanying drawings.

[Multilayer Wiring Board]

FIG. 1 is a partial longitudinal cross-sectional view showing one embodiment of the multilayer wiring board according to the present invention. In FIG. 1, a multilayer wiring board 1 according to the present invention comprises a core substrate 2, a wiring provided on the core substrate 2 in its front side 2a through an electrical insulating layer, and a wiring provided on the core substrate 2 in its back side 2b through an electrical insulating layer.

The core substrate 2 constituting the multilayer wiring board 1 comprises a core material 2' and a plurality of throughholes 4 formed in the core material 2'. Each throughhole 4 is filled with an electroconductive material 8 to render the front side 2a and the back side 2b of the core substrate 2 electrically conductive to each other through the throughhole 4.

The opening diameter of the throughholes 4 provided in the core substrate 2 is in the range of 10 to 100 μm, preferably in the range of 10 to 70 μm. When the opening diameter of the throughholes is below the lower limit of the above-defined range, the formation of the throughholes is difficult. On the other hand, when the opening diameter of the throughholes is above the upper limit of the above-defined range, disadvantageously, there is a limitation on an enhancement in throughhole density or an increase in the number of throughholes formed. An electroconductive material diffusion barrier layer 5 and an insulation layer 6 are provided on the inner wall surface of the throughholes 4 and on both sides 2a, 2b of the core substrate, and the insulation layer 6 is interposed between the electroconductive material diffusion barrier layer 5 and the electroconductive material 8.

In the embodiment shown in the drawing, the wiring provided on the front side 2a of the core substrate 2 is multilayer wiring. The multilayer wiring comprises a first wiring layer 12a provided on the front side 2a of the core substrate 2 so as to be connected to the electroconductive material 8 within the throughhole 4 by a via 13a through an electrical insulating layer 11a, a second wiring layer 12b provided on the first wiring layer 12a so as to be connected to the predetermined first wiring layer 12a by a via 13b through a second electrical insulating layer 11b, and a third wiring layer 12c provided on the second wiring layer 12b so as to be connected to the predetermined second wiring layer 12b by a via 13c through a third electrical insulating layer 11c.

In the embodiment shown in the drawing, the wiring provided on the back side 2b of the core substrate 2 is wiring having a single-layer structure, specially wiring 16 provided on the back side 2b of the core substrate 2 so as to be connected to the electroconductive material 8 within the throughhole 4 by a via 17 through an electrical insulating layer 15.

For example, each of the wiring layers 12a, 12b, 12c and 16 and each of the vias 13a, 13b, and 13c may be formed through a metallic base layer formed of a thin film of, for example, copper or silver onto the electroconductive material 8, the underlying electrical insulating layer and the via.

FIG. 2 is a partial longitudinal cross-sectional view showing another embodiment of the multilayer wiring board according to the present invention. In FIG. 2, a multilayer wiring board 1' according to the present invention has the same construction as the multilayer wiring board 1 shown in FIG. 1, except that the laminate structure of the electroconductive material diffusion barrier layer 5 and the insulation layer 6 provided on the core substrate 2 is different from that in the multilayer wiring board 1, and, in FIGS. 1 and 2, like parts are identified with the same reference characters.

In the multilayer wiring board 1', a first insulation layer 6a, an electroconductive material diffusion barrier layer 5, and a second insulation layer 6b are stacked in that order on the inner wall surface of throughholes 4 and both sides 2a, 2b of the core substrate. Accordingly, a second insulation layer 6b is interposed between the electroconductive material diffusion barrier layer 5 and the electroconductive material 8 within the throughholes 4.

The first insulation layer 6a and the second insulation layer 6b may be formed of the same material.

FIG. 3 is a partial longitudinal cross-sectional view showing another embodiment of the multilayer wiring board according to the present invention. In FIG. 3, a multilayer wiring board 1" according to the present invention has the same construction as the multilayer wiring board 1 shown in FIG. 1, except that the laminate structure of the electroconductive material diffusion barrier layer 5 and the insulation layer 6 provided on the core substrate 2 is different from that in the multilayer wiring board 1, and, in FIGS. 1 and 3, like parts are identified with the same reference characters.

In the multilayer wiring board 1", a first insulation layer 6a, a second insulation layer 6b, an electroconductive material diffusion barrier layer 5, and a third insulation layer 6c are stacked in that order on the inner wall surface of throughholes 4 and both sides 2a, 2b of the core substrate. Accordingly, a third insulation layer 6c is interposed between the electroconductive material diffusion barrier layer 5 and the electroconductive material 8 within the throughholes 4.

The second insulation layer 6b and the third insulation layer 6c may be formed of the same material. Further, all the first insulation layer 6a, the second insulation layer 6b and the third insulation layer 6c may be formed of the same material.

FIG. 4 is a partial longitudinal cross-sectional view showing a further embodiment of the multilayer wiring board according to the present invention. In FIG. 4, a multilayer wiring board 21 according to the present invention comprises a core substrate 22, a wiring provided on the core substrate 22 in its front side 22a through an electrical insulating layer, and a wiring provided on the core substrate 22 in its back side 22b through an electrical insulating layer.

The core substrate 22 constituting the multilayer wiring board 21 comprises a core material 22' and a plurality of throughholes 24 formed in the core material 22'. Each throughhole 24 is filled with an electroconductive material 28 to render the front side 22a and the back side 22b of the core substrate 22 electrically conductive to each other through the throughhole 24.

The opening diameter of the throughholes 24 provided in the core substrate 22 is in the range of 10 to 100 μm, preferably in the range of 10 to 70 μm. When the opening diameter of the throughholes is below the lower limit of the above-defined range, the formation of the throughholes is difficult. On the other hand, when the opening diameter of the throughholes is above the upper limit of the above-defined range, disadvantageously, there is a limitation on an enhancement in throughhole density or an increase in the number of throughholes formed. An electroconductive material diffusion barrier layer 25 and an insulation layer 26 are provided on the inner wall surface of the throughholes 24 and on the front side 22a of the core substrate, and the insulation layer 26 is interposed between the electroconductive material diffusion barrier layer 25 and the electroconductive material 28. An insulation layer 23 is provided on the back side 22b of the core substrate 22.

In the embodiment shown in the drawing, the wiring provided on the front side 22a of the core substrate 22 is multilayer wiring. The multilayer wiring comprises a first wiring layer 32a provided on the front side 22a of the core substrate 22 so as to be connected to the electroconductive material 28 within the throughhole 24 by a via 33a through an electrical insulating layer 31a, a second wiring layer 32b provided on the first wiring layer 32a so as to be connected to the predetermined first wiring layer 32a by a via 33b through a second electrical insulating layer 31b, and a third wiring layer 32c provided on the second wiring layer 32b so as to be connected to the predetermined second wiring layer 32b by a via 33c through a third electrical insulating layer 31c.

In the embodiment shown in the drawing, the wiring provided on the back side 22b of the core substrate 22 is wiring having a single-layer structure, specially wiring 36 provided on the back side 22b of the core substrate 22 so as to be connected to the electroconductive material 28 within the throughhole 24 by a via 37 through an electrical insulating layer 35.

For example, each of the wiring layers 32a, 32b, 32c and 36 and each of the vias 33a, 33b, and 33c may be formed through a metallic base layer formed of a thin film of, for example, copper or silver onto the electroconductive material 28, the underlying electrical insulating layer and the via.

As with the multilayer wiring boards 1', 1", in this multilayer wiring board 21, the laminate structure of the electroconductive material diffusion barrier layer 25 and the insulation layer 26 may be a laminate structure comprising the electroconductive material diffusion barrier layer 25 held between a first insulation layer and a second insulation layer, or a laminate structure comprising the electroconductive material diffusion barrier layer 25 held between first and second insulation layers and a third insulation layer.

The multilayer wiring boards 1, 1', 1", 21 according to the present invention have such a structure that an electroconductive material 8, 28 are filled into the throughholes 4, 24 and first wiring layers 12a, 16, 32a, 36 are provided through vias 13a, 17, 33a, 37 connected to the electroconductive material 8, 28, that is, a structure comprising vias 13a, 17, 33a, 37 immediately above throughholes 4, 24. This structure can enhance the degree of freedom of wiring design in multilayer wiring. Further, since any resin is not filled into the throughholes 4, 24, stress concentration, on vias 13a, 17, 33a, and 37 provided immediately above the throughholes 4, 24, caused by thermal shrinkage and thermal expansion of the core substrate 2 is less likely to occur and, thus, highly reliable connection can be realized. Furthermore, the throughholes 4, 24 can be formed at narrow pitches, and, at the same time, a space can be easily ensured among the throughholes 4, 24. Necessary wiring can be formed in this space, and, thus, desired high-density wiring can be formed in a smaller number of layers, whereby the manufacture of a thin-shaped semiconductor device can be realized. Furthermore, the electroconductive material diffusion barrier layer 5, 25 provided on the inner wall surface of the throughholes 4, 24 can prevent the diffusion of a substance constituting the electroconductive material 8, 28, filled into the throughholes, into the core substrate 2, 22, and the insulation layer 6, 26 (the second insulation layer 6b and the third insulation layer 6c) located between the electroconductive material 8, 28 and the electroconductive material diffusion barrier layer 5, 25 can prevent a change in electrical conductivity of the electroconductive material diffusion barrier layer 5, 25 caused by the diffusion of the electroconductive material 8, 28, whereby the electroconductive material diffusion barrier layer 5, 25 can develop designed electrical characteristics. Therefore, the electroconductive material diffusion preventive effect can be further enhanced, and, even in the provision of throughholes 4, 24 at narrower pitches, shortcircuiting between adjacent throughholes 4, 24 can be prevented.

The core substrate 2, 22 constituting the multilayer wiring board 1 according to the present invention can be prepared, for example, using a core material 2', 22' such as silicon or glass. The thickness of the core substrate 2, 22 is in the range of 50 to 725 μm, preferably 300 to 625 μm. When the thickness of the core substrate 2, 22 is less than 50 satisfactory strength as the support cannot be ensured. On the other hand, a thickness of the core substrate 2, 22 exceeding 725 μm disadvantageously hinders a thickness reduction in semiconductor devices.

The electroconductive material diffusion barrier layer 5, 25 provided on the inner wall surface of the throughholes 4, 24 is dense and is not particularly limited so far as it is in the form of a thin film which can prevent the diffusion of the electroconductive material into the core substrate 2, 22. For example, the electroconductive material diffusion barrier layer 5, 25 may be a thin film layer of, for example, titanium nitride, titanium or chromium. The thickness of the electroconductive material diffusion barrier layer 5, 25 may be determined, for example, in the range of 10 to 50 nm.

The insulation layer 6 constituting the multilayer wiring board 1, the second insulation layer 6b constituting the multilayer wiring board 1', the second insulation layer 6b and the third insulation layer 6c constituting the multilayer wiring board 1", and the insulation layer 26 constituting the multilayer wiring board 21 may be in the form of a thin film of an inorganic compound such as silicon dioxide or silicon nitride and may have a thickness of 10 to 4000 nm, preferably about 50 to 1000 nm.

As described above, the first insulation layer 6a constituting the multilayer wiring board 1', the first insulation layer 6a constituting the multilayer wiring board 1", and the insulation layer 23 constituting the multilayer wiring board 21 may be as described above. When the core substrate 2 is a silicon core substrate, the insulation layers may be a silicon oxide film formed by thermal oxidation.

The electroconductive material 8, 28 filled into the throughholes 4, 24 in the core substrate 2, 22 may be, for example, an electroconductive metal such as copper provided within the throughholes, for example, by filled electroplating. Alternatively, the electroconductive material 8, 28 may be provided by using an electroconductive paste containing electroconductive particles such as copper particles or silver particles. When the electroconductive paste is used as the electroconductive material 8, 28, the content of the electroconductive particles in the electroconductive paste is preferably not less than 80% by volume from the viewpoint of suppressing stress concentration on vias 13a, 17, 33a, 37 caused by thermal shrinkage and thermal expansion of the core substrate 2, 22.

The material for the first wiring layer 12a, 32a, the second wiring layer 12b, 32b, the third wiring layer 12c, 32c, and the material for the via 13a, 13b, 13c, 33a, 33b, 33c provided on the front side 2a, 22a of the core substrate 2, 22, and the material for the wiring 16, 36 and the via 17, 37 provided on the back side 2b, 22b of the core substrate 2, 22 may be, for example, an electroconductive material such as copper or nickel. The thickness of each wiring layer may be determined, for example, in the range of 3 to 20 μm. The diameter of the vias may be determined, for example, in the range of 20 to 100 μm.

Further, the material for the electrical insulating layer 11a, 11b, 11c, 31a, 31b, 31c and the electrical insulating layer 15, 35 may be an organic insulating material such as an epoxy resin, a benzocyclobutene resin, a cardo resin, a polyimide resin or fluorene. The thickness of the electrical insulating layer may be determined, for example, in the range of 3 to 20 μm.

In the above embodiments, wiring 12a, 12b, 12c, 32a, 32b, 32c is formed on the front side 2a, 22a of the core substrate 2, 22, and wiring 16, 36 is formed on the back side of the core substrate 2, 22. In the present invention, however, there is no limitation on the number of wiring layers provided on the core substrate.

Further, in the multilayer wiring board according to the present invention, the outermost wiring layer may be provided with a terminal pad for semiconductor chip mounting. Further, a solder layer may be provided on the surface of the terminal pad.

Method for Manufacturing Multilayer Wiring Board

The method for manufacturing a multilayer wiring board according to the present invention will be described with reference to the accompanying drawings.

FIGS. 5 to 7 are process diagrams showing one embodiment of the method for manufacturing a multilayer wiring board according to the present invention, wherein a multilayer wiring board 1 shown in FIG. 1 is manufactured as an example.

In the method for manufacturing a multilayer wiring board according to the present invention, a mask pattern 9 having predetermined openings 9a is formed on one side 2'a of a core material 2' for a core substrate. Pores 4' having a predetermined depth are bored in the core material 2' by ICP-RIE (inductive coupled plasma-reactive ion etching), which is a dry etching method utilizing plasma, using the mask pattern 9 as a mask (FIG. 5 (A)).

For example, silicon or glass may be used as the core material 2'. The mask pattern 9 may be formed using a material resistant to dry etching, for example, using a positive-working resist using a novolak resin. Alternatively, the mask pattern 21 may be formed using a material having a smaller etching selection ratio (a smaller etching rate) than the core material 2', for example, silicon oxide or silicon nitride, on the core material 2' of silicon.

The opening diameter of the pores 4' may be properly determined in the range of 10 to 100 μm, preferably 10 to 70 μm. Further, the depth of the pores 4' may be determined by taking into consideration, the thickness of the core substrate to be prepared, for example, 50 to 725 μm and may be determined, for example, in the range of 70 to 745 μm. In the manufacturing method according to the present invention, since the pores 4' for throughholes are formed by dry etching utilizing plasma, throughholes having a small opening diameter can be formed.

The mask pattern 9 is then removed from the core material 2', and the other side 2'b of the core material 2' is polished to exposed the pores 4' and thus to form throughholes 4. Thereafter, an electroconductive material diffusion barrier layer 5 and an insulation layer 6 are formed on both side of the core material 2' and on the inner wall surface of the throughhholes 4 (FIG. 5 (B)).

The electroconductive material diffusion barrier layer 5 may be in the form of a thin film of, for example, titanium nitride, titanium or chromium. This electroconductive material diffusion barrier layer 5 may be formed, for example, by MO-CVD (metal organic-chemical vapor deposition) or sputtering. In particular, when the opening diameter of the throughholes 4 is not more than 70 μm, the electroconductive material diffusion barrier layer 5 is preferably formed by MO-CVD.

The insulation layer 6 may be, for example, a silicon oxide film or a silicon nitride film formed, for example, by plasma CVD (plasma enhanced-chemical vapor deposition). The thickness of the insulation layer 6 may be determined, for example, in the range of 500 to 1000 nm.

When the laminate structure of the electroconductive material diffusion barrier layer 5 and the insulation layer 6 is a laminate structure as in the multilayer wiring board 1' (FIG. 2), that is, a structure in which a first insulation layer 6a, an electroconductive material diffusion barrier layer 5, and a second insulation layer 6b are stacked in that order, or a laminate structure as in the multilayer wiring board 1" (FIG. 3), that is, a structure in which a first insulation layer 6a, a second insulation layer 6b, an electroconductive material diffusion barrier layer 5, and a third insulation layer 6c are stacked in that order, the first insulation layer 6a, the second insulation layer 6b, and the third insulation layer 6c may be formed in the same manner as in the formation of the insulation layer 6. When the core material 2' is silicon, the first insulation layer 6a may be formed as a silicon oxide film by thermal oxidation.

An electroconductive base layer 7 is then formed on the insulation layer 6 (FIG. 5 (C)). The electroconductive base layer 7 may be, for example, a thin film of copper, nickel or the like, or a laminated thin film of titanium/copper. The electroconductive base layer 7 may be formed, for example, by MO-CVD (metal organic-chemical vapor deposition) or sputtering. In particular, when the opening diameter of the throughholes 4 is not more than 70 μm, the electroconductive base layer 7 is preferably formed by MO-CVD. The electroconductive base layer 7 should cover the insulation layer 6 in its part present on the inner wall surface of the throughholes 4. For both sides of the core substrate 2, the electroconductive base layer 7 may be formed at desired sites.

Next, a desired resist film 10a, 10b is formed on the electroconductive base layer 7 and the insulation layer 6, and an electroconductive material 8 such as copper or nickel is filled into the throughholes 4 by filled electroplating using the electroconductive base layer 7 as a seed layer (FIG. 5 (D)). The resist film 10a, 10b may be formed using a conventional photosensitive resist material, and the thickness of the resist film 10a, 10b may be determined, for example, in the range of 1 to 100 μm.

In this filled electroplating, the resist films 10a, 10b are not in adhesion to the electroconductive material diffusion barrier layer 5 but in adhesion to the insulation layer 6 or the electroconductive base layer 7. Accordingly, the adhesive strength of the resist films is so high that there is no possibility that the electroconductive material 8 enters the interface of the insulation layer 6 or the electroconductive base layer 7 and the resist films 10a, 10b and consequently is unnecessarily spread. Therefore, the electroconductive material 8 can be filled with high accuracy which has reflected the pattern of the resist films 10a, 10b.

An electroconductive paste may be filled as the electroconductive material 8 into the throughholes 4, for example, by screen printing. In this case, preferably, the electroconductive paste contains not less than 80% by volume of electroconductive particles such as copper particles or silver particles.

Next, the resist films 10a, 10b are removed, and, if necessary, the excess electroconductive material 8 protruded on the core material 2' is removed by polishing to allow the electroconductive material 8 only in its part located within the throughholes 4 to stay and thus to prepare a core substrate 2 of which the front side and back side have been electrically conducted to each other by the electroconductive material 8 filled into the throughholes 4 (FIG. 6 (A)). Even when the excess electroconductive material 8 is removed by polishing as described above, there is no possibility that the electroconductive material 8 enters the interface of the insulation layer 6 or the electroconductive base layer 7 and the resist films 10a, 10b resulting in unnecessary spreading of the electroconductive material 8. Accordingly, only the excess electroconductive material 8 can be removed by polishing without damage to the insulation layer 6 and the electroconductive material diffusion barrier layer 5.

Next, a photosensitive insulating material is coated as an electrical insulating layer for a first wiring layer onto both sides of the core substrate 2, and the coating is exposed and developed in a predetermined pattern to form electrical insulating layers 11a, 15 (FIG. 6 (B)). The electrical insulating layers 11a, 15 may be formed, for example, using a photosensitive insulating material such as benzocyclobutene, polyimide or fluorene, and the thickness of the electrical insulating layers 11a, 15 may be determined, for example, in the range of 3 to 20 μm.

Next, metallic base layers 12'a, 16' are formed so as to cover the electrical insulating layers 11a, 15 to form a resist pattern 19 on the electrical insulating layers 11a, 15 (FIG. 6 (C)). The metallic base layers 12'a, 16' may be a thin film formed, for example, by sputtering and may be a thin film of copper, silver or the like. The metallic base layers 12'a, 16' may have a laminated structure of the above thin film and an intimate contact film of chromium, titanium, titanium nitride or the like. The thickness of the metallic base layer may be determined, for example, in the range of 50 to 350 nm.

The resist pattern 19 has openings 19a through which the metallic base layers 12'a, 16' located on the electroconductive material 8 filled into the throughholes 4 are exposed.

Electroplating is then carried out using this resist pattern 19 as a mask and the metallic base layers 12'a, 16' as a seed layer, and the resist pattern 19 is then removed, whereby wiring 12a connected through a via 13a to the electroconductive material 8 filled into the throughholes 4 and wiring 16 connected through a via 17 to the electroconductive material 8 filled into the throughholes 4 are formed (FIG. 7 (A)). The material for the wiring and via may be, for example, an electroconductive material such as copper or nickel.

Thereafter, the excess metallic base layers 12'a, 16' located on the electrical insulating layers 11a, 15 are removed to form a first wiring layer through an electrical insulating layer on both sides of the core substrate 2. This wiring is connected through the via to the electroconductive material 8 filled into the throughholes 4 (FIG. 7 (B)).

The steps shown in FIGS. 6 (B) to 7 (B) are then repeated to further form any desired number of wiring layers on the front side 2a and/or the back side 2b of the core substrate 2 and thus to prepare a desired multilayer wiring board.

Figure 8:
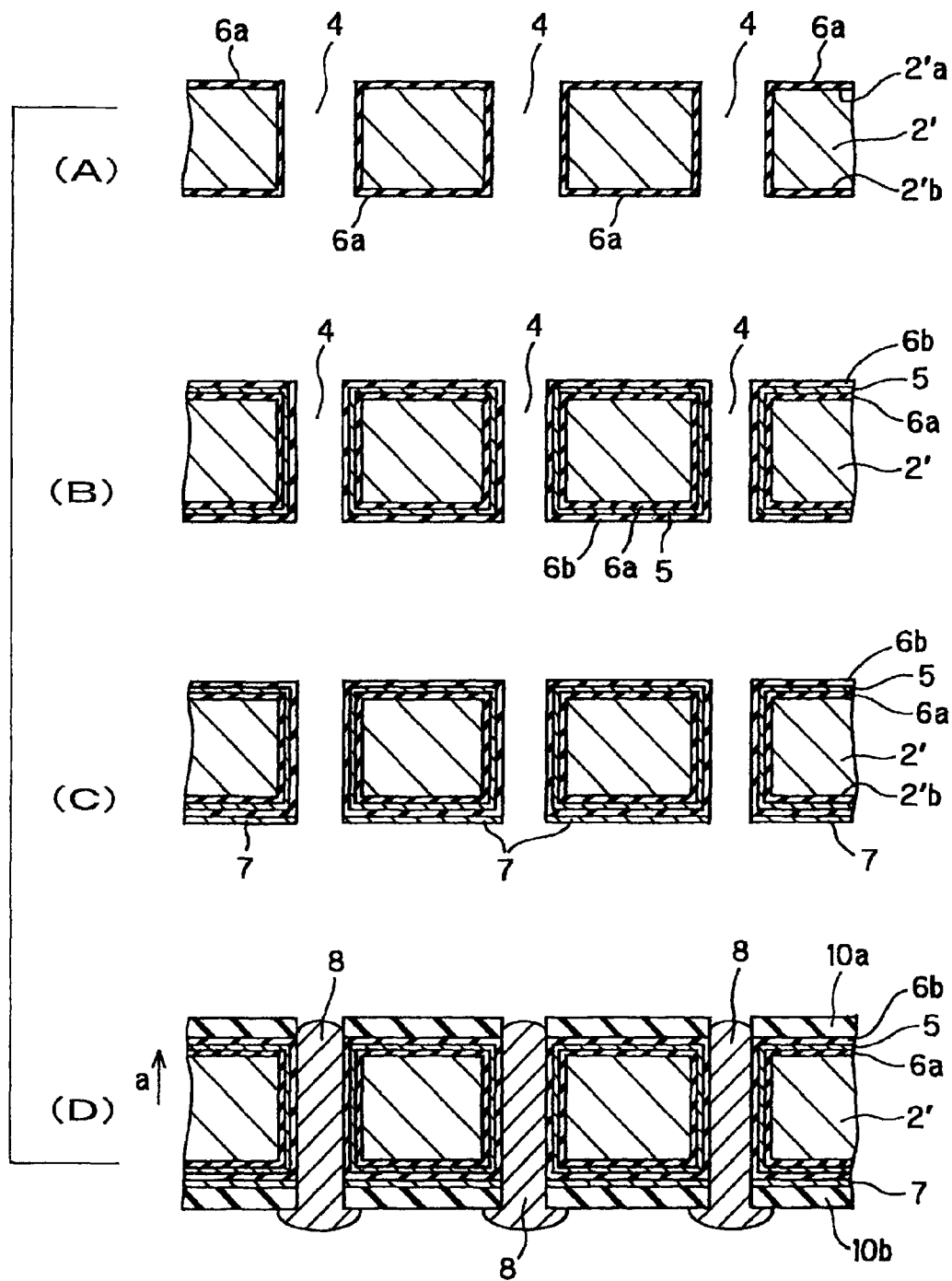
FIG. 8 is a process diagram showing another embodiment of the method for manufacturing a multilayer wiring board according to the present invention.

FIGS. 8 and 9 are process diagrams showing another embodiment of the method for manufacturing a multilayer wiring board according to the present invention, wherein a multilayer wiring board 1' shown in FIG. 2 is manufactured as an example.

In the method for manufacturing a multilayer wiring board according to the present invention, at the outset, as with the above embodiment, throughholes 4 are formed in the core material 2'. Thereafter, a first insulation layer 6a is formed on both sides of the core material 2' and the inner wall surface of the throughholes 4 (FIG. 8 (A)). The first insulation layer 6a may be, for example, a silicon oxide or silicon nitride film formed, for example, by plasma CVD. The thickness of the insulation layer 6a may be determined, for example, in the range of 500 to 1000 nm. When the core material 2' is silicon, the first insulation layer 6a may be formed as a silicon oxide film by thermal oxidation of the silicon.

An electroconductive material diffusion barrier layer 5 and a second insulation layer 6b are then formed on the first insulation layer 6a (FIG. 8 (B)). The electroconductive material diffusion barrier layer 5 and the second insulation layer 6b may be formed in the same manner as in the formation of the above-described electroconductive material diffusion barrier layer 5 and the insulation layer 6.

Alternatively, a structure in which an electroconductive material diffusion barrier layer 5 and an insulation layer 6 are stacked in that order as in the multilayer wiring board 1 (FIG. 1) or a structure in which a first insulation layer 6a, a second insulation layer 6b, an electroconductive material diffusion barrier layer 5, and a third insulation layer 6c are stacked in that order as in the multilayer wiring board 1" (FIG. 3), may also be adopted.

Next, an electroconductive base layer 7 is formed on the second insulation layer 6b on one side (2'b side in the embodiment shown in the drawing) of the core material 2' (FIG. 8 (C)). The electroconductive base layer 7 may be, for example, a thin film of copper, nickel or the like or a laminated thin film of titanium/copper. The electroconductive base layer 7 may be formed, for example, by vapor deposition, sputtering or MO-CVD.

Desired resist films 10a, 10b are then formed on the electroconductive base layer 7 and on the second insulation layer 6b on the other side (2'a side in the embodiment shown in the drawing) of the core material 2', and filled electroplating is carried out using the electroconductive base layer 7 as a seed layer to allow an electroconductive material 8 such as copper or nickel to be deposited and grown in one direction (indicated by an arrow a) within the throughholes 4 and thus to be filled into the throughholes 4 (FIG. 8 (D)). The resist films 10a, 10b may be formed using a conventional photosensitive resist material. The thickness of the resist films 10a, 10b may be determined, for example, in the range of 1 to 100 μm.

In this filled electroplating, the resist films 10a, 10b are not in adhesion to the electroconductive material diffusion barrier layer 5 but in adhesion to the second insulation layer 6b or the electroconductive base layer 7. Accordingly, the adhesive strength of the resist film is so high that there is no possibility that the electroconductive material 8 enters the interface of the second insulation layer 6b or the electroconductive base layer 7 and the resist films 10a, 10b, particularly the interface of the second insulation layer 6b, located in the direction of deposition and growth of the electroconductive material 8, and the resist film 10a, and consequently is unnecessarily spread. Therefore, the electroconductive material 8 can be filled with high accuracy which has reflected the pattern of the resist films 10a, 10b.

Next, the resist films 10a, 10b are removed, and, if necessary, the excess electroconductive material 8 protruded on the core material 2' is removed by polishing to allow the electroconductive material 8 only in its part located within the throughholes 4 to stay and thus to prepare a core substrate 2 of which the front side and back side have been electrically conducted to each other by the electroconductive material 8 filled into the throughholes 4 (FIG. 9 (A)). Even when the excess electroconductive material 8 is removed by polishing as described above, there is no possibility that the electroconductive material 8 enters the interface of the second insulation layer 6b or the electroconductive base layer 7 and the resist film 10a, 10b resulting in unnecessary spreading of the electroconductive material 8. Accordingly, only the excess electroconductive material 8 can be removed by polishing without damage to the second insulation layer 6b and the electroconductive material diffusion barrier layer 5.

Next, a photosensitive insulating material is coated as an electrical insulating layer for a first wiring layer onto both sides of the core substrate 2, and the coating is exposed and developed in a predetermined pattern to form electrical insulating layers 11a, 15. Metallic base layer 12'a, 16' are formed so as to cover the electrical insulating layers 11a, 15 (FIG. 9 (B)). The metallic base layers 12'a, 16' may be formed in the same manner as in the above embodiment.

Next, a resist pattern is formed on the electrical insulating layers 11a, 15, and electroplating is carried out using this resist pattern as a mask and the metallic base layers 12'a, 16' as a seed layer. Thereafter, the resist pattern is removed to remove the excess metallic base layers 12'a, 16' exposed on the electrical insulating layers 11a, 15, whereby wiring 12a connected through a via 13a to the electroconductive material 8 filled into the throughholes 4 and wiring 16 connected through a via 17 to the electroconductive material 8 filled into the throughholes 4 are formed (FIG. 9 (C)). The resist pattern has openings through which the metallic base layers 12'a, 16' on the electroconductive material 8 filled into the throughholes 4 are exposed. The resist pattern may be formed in the same manner as in the above embodiments.

Thereafter, the steps shown in FIGS. 9 (B) and 9 (C) are then repeated to further form any desired number of wiring layers on the front side 2a and/or the back side 2b of the core substrate 2 and thus to prepare a desired multilayer wiring board.

Figure 11:
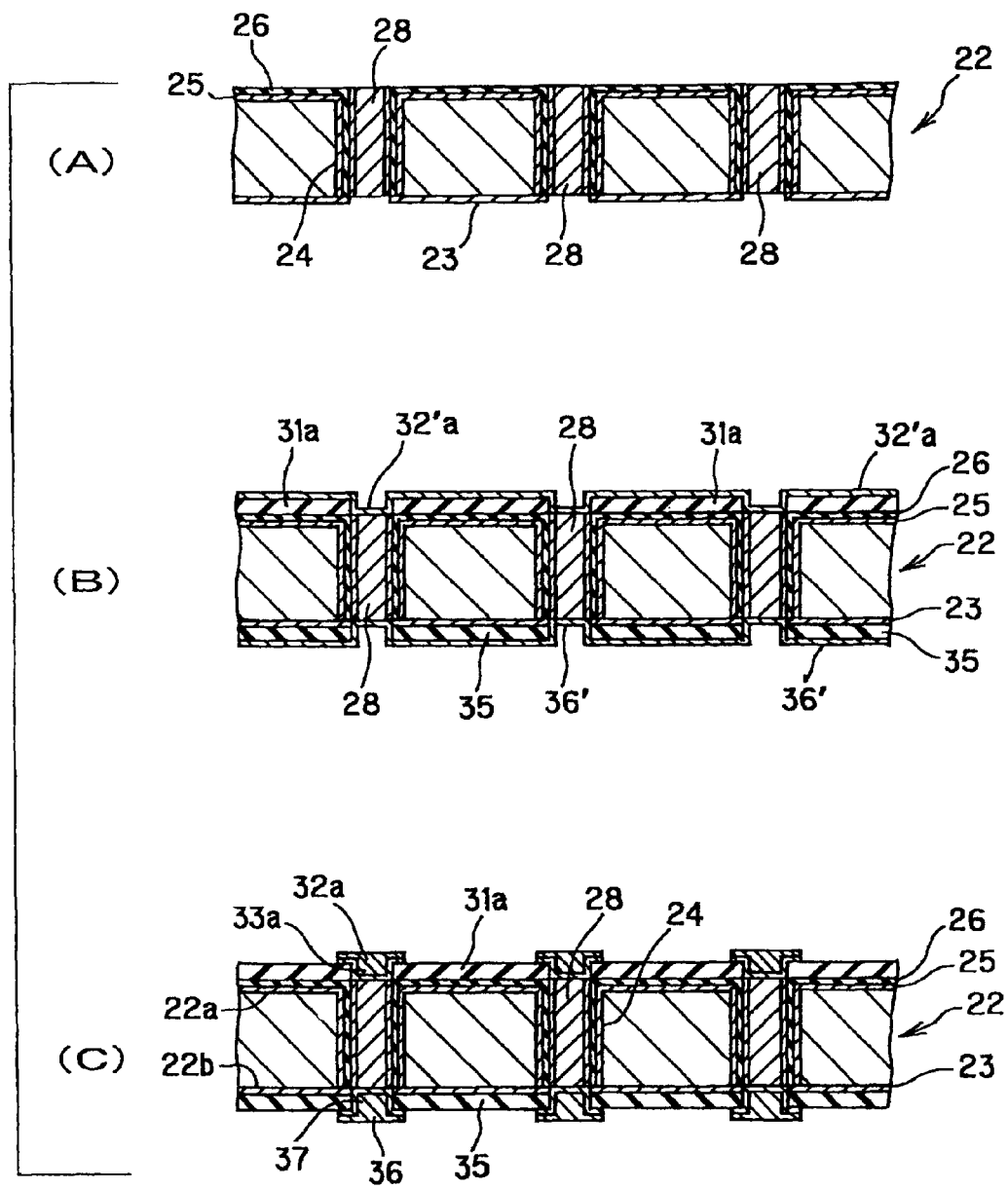
FIG. 11 is a process diagram showing another embodiment of the method for manufacturing a multilayer wiring board according to the present invention.

FIGS. 10 and 11 are process diagrams showing another embodiment of the method for manufacturing a multilayer wiring board according to the present invention, wherein a multilayer wiring board 21 shown in FIG. 4 is manufactured as an example.

In the method for manufacturing a multilayer wiring board according to the present invention, a mask pattern 29 having predetermined openings 29a is provided on one side 22'a of a core material 22' for a core substrate. Pores 24' having a predetermined depth are bored in the core material 22' by ICP-RIE (inductive coupled plasma-reactive ion etching), which is a dry etching method utilizing plasma, using the mask pattern 29 as a mask (FIG. 10 (A)).

The core material 22' may be the same as the core material 2' in the above embodiment, and the mask pattern 29 may be formed in the same manner as in the formation of the mask pattern 9 in the above embodiment.

The opening diameter of the pores 24' may be properly determined in the range of 10 to 100 µm, preferably 10 to 70 µm. Further, the depth of the pores 4' may be determined by taking into consideration, the thickness of the core substrate to be prepared, for example, 50 to 725 µm and may be properly determined, for example, in the range of 70 to 745 µm. In the manufacturing method according to the present invention, since the pores 4' for throughholes are formed by dry etching utilizing plasma, throughholes having a small opening diameter can be formed.

The mask pattern 29 is then removed from the core material 22'. An electroconductive material diffusion barrier layer 25 is formed on the front side of the core material 22' and on the inner wall surface of the pores 24', and an insulation layer 26 is formed so as to cover the electroconductive material diffusion barrier layer 25 (FIG. 10 (B)). The electroconductive material diffusion barrier layer 25 and the insulation layer 26 may be formed in the same manner as in the formation of the electroconductive material diffusion barrier layer 5 and the insulation layer 6 in the above embodiment. Alternatively, a structure in which a first insulation layer, an electroconductive material diffusion barrier layer, and a second insulation layer are stacked in that order as in the multilayer wiring board 1' (FIG. 2), or a structure in which a first insulation layer, a second insulation layer, an electroconductive material diffusion barrier layer, and a third insulation layer are stacked in that order as in the multilayer wiring board 1" (FIG. 3), may be adopted.

A desired electroconductive base layer 27 is then formed on the insulation layer 26, and a desired resist film 30 is formed on the electroconductive base layer 27 and the insulation layer 26. The electroconductive base layer 27 should cover the insulation layer 26 in its part located on the inner wall surface of the pores 24', but on the other hand, may be formed at desired sites on the insulation layer in its part located on the core material 22. An electroconductive material 28 such as copper or nickel is then filled into the pores 24' by filled electroplating using the electroconductive base layer 27 as a seed layer (FIG. 10 (C)). The electroconductive base layer 27 and the resist film 30 may be formed in the same manner as in the formation of the electroconductive base layer 7 and the resist film 30 in the above embodiment.

In this filled electroplating, the resist film 30 is not in adhesion to the electroconductive material diffusion barrier layer 25 but in adhesion to the insulation layer 26 or the electroconductive base layer 27. Accordingly, the adhesive strength of the resist film 30 is so high that there is no possibility that the electroconductive material 28 enters the interface of the insulation layer 26 or the electroconductive base layer 27 and the resist film 30 and consequently is unnecessarily spread. Therefore, the electroconductive material 28 can be filled into the pores 24' with high accuracy which has reflected the pattern of the resist film 30.

The excess electroconductive material 28 protruded on the core material 22' is then removed by polishing to allow the electroconductive material 28 to stay only within the pores 24'. Further, the core material 22' on its other side 22'b is polished to expose the pores 24' and thus to form throughholes 24, and an insulation layer 23 is formed on the polished face. Thus, a core substrate 22 of which the front side and back side have been electrically conducted to each other by the electroconductive material 28 filled into the throughholes 24, was provided (FIG. 11 (A)). Also when the excess electroconductive material 28 is removed by polishing as described above, there is no possibility that the electroconductive material 28 enters the interface of the insulation layer 26 or the electroconductive base layer 27 and the resist film 30 and consequently is unnecessarily spread. Accordingly, only the excess electroconductive material 28 can be removed by polishing without damage to the insulation layer 26 and the electroconductive material diffusion barrier layer 25.

The insulation layer 23 may be, for example, a silicon oxide or silicon nitride film formed, for example, by plasma CVD (chemical vapor deposition). The thickness of the insulation layer 23 may be determined, for example, in the range of 500 to 1000 nm. When the core material 22' is silicon, the insulation layer 23 may be formed as a silicon oxide film by thermal oxidation of the silicon.

Next, a photosensitive insulating material is coated onto both sides of the core substrate 22, and the coating is exposed in a predetermined pattern and is developed to form electrical insulating layers 31a, 35 as an electrical insulating layer for a first wiring layer. Metallic base layers 32'a, 36' are formed so as to cover the electrical insulating layers 31a, 35 (FIG. 11 (B)). The metallic base layers 32'a, 36' may be formed in the same manner as in the formation of the metallic base layers 12'a, 16' in the above embodiment.

Next, a resist pattern is formed on the electrical insulating layers 31a, 35, and electroplating is carried out using this resist pattern as a mask and the metallic base layers 32'a, 36' as a seed layer. Thereafter, the resist pattern is removed to remove the excess metallic base layers 32'a, 36' exposed on the electrical insulating layer 31a, 35, whereby wiring 32a connected through a via 33a to the electroconductive material 28 filled into the throughholes 24 and wiring 36 connected through a via 37 to the electroconductive material 28 filled into the throughholes 24 are formed (FIG. 11 (C)). The resist pattern has openings through which the metallic base layer 32'a, 36' on the electroconductive material 28 filled into the throughholes 24 are exposed. The resist pattern may be formed in the same manner as in the above embodiments.

Thereafter, the steps shown in FIGS. 11 (B) and 11 (C) are then repeated to form any desired number of wiring layers on the front side 22a and/or the back side 22b of the core substrate 22 and thus to prepare a desired multilayer wiring board.

It should be noted that the above embodiments of the multilayer wiring board and manufacturing method are merely an example and should not be construed as limiting the present invention.

EXAMPLES

The following Examples further illustrate the present invention.

Example 1

A silicon substrate having a thickness of 625 µm and a diameter of 150 mm was provided as a core material. A novolak positive-working resist material (PMER-P-LA900PM, manufactured by Tokyo Ohka Kogyo Co., Ltd.) was coated onto one side of the core material, and the assembly was exposed and developed through a photomask for throughhole formation. Thus, mask patterns having four types of circular openings respectively with diameters of 10

μm, 30 μm, 70 μm, and 100 μm were formed. More specifically, a mask pattern having circular openings with a diameter of 10 μm provided at pitches of 20 μm, a mask pattern having circular openings with a diameter of 30 μm provided at pitches of 60 μm, a mask pattern having circular openings with a diameter of 70 μm provided at pitches of 150 μm, and a mask pattern having circular openings with a diameter of 100 μm provided at pitches of 200 μm were formed.

Next, the core material was dry etched by ICP-RIE (inductive coupled plasma-reactive ion etching) using the mask pattern as a mask to form a plurality of pores. The depth of the pores was about 350 μm.

The unnecessary mask pattern was then removed, and the back side of the core material was polished to expose pores and thus to form throughholes. The core material was then washed, and a 10 nm-thick electroconductive material diffusion barrier layer of titanium nitride was then formed by MO-CVD (metal organic-chemical vapor deposition) onto both sides of the core material and the inner wall surface of the throughholes.

Next, a 3 μm-thick insulation layer formed of silicon dioxide was formed by plasma CVD (plasma enhanced-chemical vapor deposition) so as to cover the electroconductive material diffusion barrier layer.

An electroconductive paste (containing 85% by volume of silver-coated copper particles having an average particle diameter of 2.5 μm) was then filled into the throughholes by screen printing, followed by curing treatment (160° C., 20 min). Thereafter, the electroconductive paste in its part protruded on the surface of the core material was removed by polishing to render the electroconductive paste within the throughholes level with the surface of the core material. Thus, a core substrate having four types of throughholes respectively having opening diameters of 10 μm, 30 μm, 70 μm, and 100 μm, the front side and back side of the core substrate having been electrically conducted to each other by the electroconductive material of the electroconductive paste filled into the throughholes, was prepared (a core substrate as shown in FIG. 1).

Next, photosensitive benzocyclobutene (Cyclotene-4024-40, manufactured by DOW) was coated on both sides of the core substrate, and the coating was exposed and developed in a predetermined pattern and was cured to form an electrical insulating layer (thickness 10 μm) as a first wiring layer. This electrical insulating layer had such a pattern that the electroconductive paste filled into the throughholes was exposed on the surface of the core substrate.

A metallic base layer having a laminated structure of a thin film of chromium (thickness 30 nm) and a thin film of copper (thickness 200 nm) was then formed by sputtering so as to cover the electrical insulating layer.

Next, a resist pattern was formed on the electrical insulating layers so that the metallic base layer on the electroconductive paste filled into the throughholes is exposed on the surface of the assembly. Thereafter, electroplating was carried out using the resist pattern as a mask and the metallic base layer as a seed layer to form a 4 μm-thick copper layer. Subsequently, the resist pattern was removed, and the excess metallic base layer exposed on the electrical insulating layer was removed. In the removal of the metallic base layer, the thin film of copper was first removed with a sodium persulfate solution, and the thin film of chromium was then removed with an alkaline sodium permanganate solution. Thus, wiring connected through vias to the electroconductive material filled into the throughholes was formed on both sides of the core substrate.

The above wiring formation was repeated to form two or more wiring layers to prepare a desired multilayer wiring board. Example 2

The same core material as used in Example 1 was first provided, and a plurality of pores were formed in the core material by ICP-RIE dry etching. The depth of the pores was about 350 μm.

Next, a 10 nm-thick electroconductive material diffusion barrier layer formed of titanium nitride was formed by MO-CVD on the surface of the core material provided with the pores and the inner wall surface of the pores. A 3 μm-thick insulation layer of silicon dioxide was then formed by plasma CVD so as to cover the electroconductive material diffusion barrier layer.

A 200 nm-thick electroconductive base layer of copper was then formed on the insulation layer by sputtering. A photosensitive film resist (SUNFORT SPG152, manufactured by Asahi Kasei EMD Corporation) was then laminated thereonto, followed by exposure in a predetermined pattern and development to form a resist film so that the pores were exposed.

Pulse electroplating (DT cycle 10%, average current density 0.2 A/dm$^2$) was then carried out for 15 hr with a filled plating solution having the following composition using the electrocoductive base layer as a seed layer to conduct copper plating on the surface of the core base material to fully fill copper into the pores.

(Composition of Filled Plating Solution)

| | |
|---|---|
| Sulfuric acid | 50 g/L |
| Copper sulfate | 200 g/L |
| Chloride ion | 50 mg/L |
| Additive (ESA21-A, manufactured by C. Uyemura & Company Ltd.) | 2.5 mL/L |
| Additive (ESA21-B, manufactured by C. Uyemura & Company Ltd.) | 10 mL/L |

The resist film was then removed with CLEAN-THROUGH KS7405, manufactured by Kao Corp., and the exposed electroconductive base layer was removed with a sodium persulfate solution. Next, the excess copper film protruded from the core material was removed by polishing, and the back side of the core material was then polished to expose the pores and thus to form throughholes. An insulation layer (thickness 100 nm) of silicon oxide was then formed by reactive sputtering on the core material surface exposed by the above polishing. Thereafter, a resist pattern was formed on the insulation layer, and openings were formed in the insulation layer by wet etching with hydrogen fluoride. The openings were formed so that the copper filled into the throughholes was exposed. Thus, a core substrate (a core substrate as shown in FIG. 4) of which the front side and back side have been electrically conducted to each other by the filled copper plating filled into the throughholes, was prepared. The core substrate had four types of throughholes respectively having opening diameters of 10 μm, 30 μm, 70 μm, and 100 μm. The openings having a diameter of 10 μm were formed at pitches of 20 μm, the openings having a diameter of 30 μm were formed at pitches of 60 μm, the openings having a diameter of 70 μm were formed at pitches of 150 μm, and the openings having a diameter of 100 μm were formed at pitches of 200 μm.

Next, in the same manner as in Example 1, two or more wiring layers were formed on the core substrate to prepare a desired multilayer wiring board.

Example 3

The same core material as used in Example 1 was first provided. Throughholes were formed in the core material in the same manner as in Example 1.

Next, the core material was subjected to thermal oxidation (1050° C., 20 min) to form an 800 nm-thick first insulation layer on both sides of the core material and the inner wall surface of the throughholes.

A 30 nm-thick electroconductive material diffusion barrier layer formed of titanium nitride was then formed by MO-CVD on the first insulation layer. A 1 μm-thick second insulation layer of silicon dioxide was then formed by plasma CVD so as to cover the electroconductive material diffusion barrier layer.

An electroconductive base layer formed of a laminate of 30 nm-thick layer of titanium and a 200 nm-thick layer of copper was then formed by sputtering on the second insulation layer on one side of the core material.

A photosensitive film resist (SUNFORT SPG152, manufactured by Asahi Kasei EMD Corporation) was then laminated onto both sides of the core material followed by exposure in a predetermined pattern and development to form a resist film so that the throughholes were exposed.

Electroplating (average current density 1 A/dm$^2$) was then carried out for 5 hr with the same filled plating solution as used in Example 2 and using the electroconductive base layer as a seed layer to allow copper to be deposited and grown in one direction from the electroconductive base layer-formed face into the throughholes and thus to fully fill copper into the throughholes.

The resist film was then removed with CLEAN-THROUGH KS7405, manufactured by Kao Corp., and the exposed electroconductive base layer was removed. In the removal of the metallic base layer, the thin film of copper was first removed with a sodium persulfate solution, and the thin film of titanium was then removed with WLC-T, manufactured by Mitsubishi Gas Chemical Co., Inc. Subsequently, the excess copper film protruded from the core material was removed by polishing. Thus, a core substrate (a core substrate as shown in FIG. 2) of which the front side and back side have been electrically conducted to each other by the filled copper plating filled into the throughholes, was prepared.

Next, two or more wiring layers were formed on the core substrate in the same manner as in Example 1 to prepare a desired multilayer wiring board.

Example 4

A core substrate (a core substrate as shown in FIG. 2) of which the front side and back side have been electrically conducted to each other by filled copper plating was prepared in the same manner as in Example 3, except that an electroconductive base layer formed of a laminate of a 30 nm-thick titanium layer and a 200 nm-thick copper layer was formed by using vapor deposition instead of sputtering, and a filled plating solution having the following composition was used.

(Composition of filled plating solution)

| | |
|---|---|
| CU-BRITE VFII A (manufactured by EBARA-UDYLITE CO., LTD.) | 50 mL/L |
| CU-BRITE VFII B (manufactured by EBARA-UDYLITE CO., LTD.) | 4 mL/L |
| Sulfuric acid | 50 g/L |
| Copper sulfate | 200 g/L |
| Hydrochloric acid | 40 g/L |

Two or more wiring layers were then formed on the core substrate in the same manner as in Example 1 to prepare a desired multilayer wiring board.

Example 5

The same core material as used in Example 1 was first provided. Throughholes were formed in the core material in the same manner as in Example 1.

The core material was then cleaned, and a 1 μm-thick first insulation layer of silicon dioxide was formed by plasma CVD on both sides of the core material and the inner wall surface of the throughholes.

A 30 nm-thick electroconductive material diffusion barrier layer of titanium nitride was then formed by MO-CVD on the first insulation layer. Next, a 1 μm-thick second insulation layer of silicon dioxide was formed by plasma CVD so as to cover the electroconductive material diffusion barrier layer.

Next, in the same manner as in Example 3, an electroconductive base layer was formed, a resist film was formed so that the throughholes were exposed, and electroplating was carried out with the same filled plating solution as used in Example 2 using the electroconductive base layer as a seed layer to fully fill copper into the throughholes.

The resist film was then removed, and the electroconductive base layer exposed on the surface was removed. The excess copper film protruded from the core material was then removed by polishing. Thus, a core substrate (a core substrate as shown in FIG. 2) of which the front side and back side have been electrically conducted to each other by the filled copper plating filled into the throughholes, was prepared.

Next, in the same manner as in Example 1, two or more wiring layers were formed on the core substrate to prepare a desired multilayer wiring board.

Example 6

A core substrate (a core substrate as shown in FIG. 2) of which the front side and back side have been electrically conducted to each other by filled copper plating, was prepared in the same manner as in Example 5, except that an electroconductive base layer formed of a laminate of a 30 nm-thick titanium layer and a 200 nm-thick copper layer was formed by using vapor deposition instead of sputtering, and the same filled plating solution as in Example 4 was used.

Next, in the same manner as in Example 1, two or more wiring layers were formed on the core substrate to prepare a desired multilayer wiring board.

Example 7

The same core material as used in Example 1 was first provided. Throughholes were formed in the core material in the same manner as in Example 1.

Next, the core material was subjected to thermal oxidation (1050° C., 20 min) to form an 800 nm-thick first insulation layer on both sides of the core material and the inner wall surface of the throughholes.

A 1 μm-thick second insulation layer of silicon dioxide was then formed by plasma CVD on the first insulation layer. A 30 nm-thick electroconductive material diffusion barrier layer formed of titanium nitride was then formed by MO-CVD on the second insulation layer. Thereafter, a 1 μm-thick third insulation layer of silicon dioxide was formed by plasma CVD so as to cover the electroconductive material diffusion barrier layer.

An electroconductive base layer formed of a laminate of a 30 nm-thick layer of titanium and a 200 nm-thick layer of copper was then formed by vapor deposition. Thereafter, in the same manner as in Example 4, a resist film was formed so that the throughholes were exposed followed by electroplating with the same filled plating solution as used in Example 4 using the electroconductive base layer as a seed layer to fully fill copper into the throughholes.

The resist film was then removed, and the electroconductive base layer exposed on the surface was removed. The excess copper film protruded from the core material was then removed by polishing. Thus, a core substrate (a core substrate as shown in FIG. 3) of which the front side and back side have been electrically conducted to each other by the filled copper plating filled into the throughholes, was prepared.

Next, in the same manner as in Example 1, two or more wiring layers were formed on the core substrate to prepare a desired multilayer wiring board.

Example 8

The same core material as used in Example 1 was first provided, and a plurality of pores were formed in the core material by ICP-RIE dry etching. The depth of the pores was about 350 μm.

Next, the core material was subjected to thermal oxidation (1050° C., 20 min) to form an 800 nm-thick first insulation layer on both sides of the core material and the inner wall surface of the pores.

A 1 μm-thick second insulation layer of silicon dioxide was then formed by plasma CVD on the first insulation layer. A 30 nm-thick electroconductive material diffusion barrier layer formed of titanium nitride was then formed by MO-CVD on the second insulation layer. Thereafter, a 1 μm-thick third insulation layer of silicon dioxide was formed by plasma CVD so as to cover the electroconductive material diffusion barrier layer.

Next, in the same manner as in Example 2, an electroconductive base layer was formed, a resist film was formed so that the pores were exposed, and electroplating was carried out with the same filled plating solution as used in Example 2 using the electroconductive base layer as a seed layer to fully fill copper into the throughholes.

Next, in the same manner as in Example 2, the resist film was removed, and the electroconductive base layer exposed on the surface was removed. The excess copper film protruded from the core material was removed by polishing. Thereafter, the back side of the core material was polished to expose the pores and thus to form throughholes.

Next, in the same manner as in Example 2, an insulation layer (thickness 100 nm) of silicon oxide was formed on the core material surface exposed by polishing, and openings were formed in the insulation layer so that copper filled into the throughholes was exposed. Thus, a core substrate (the same core substrate as shown in FIG. 4 except that the insulation layer was provided on both sides of the electroconductive material diffusion barrier layer 25) of which the front side and back side have been electrically conducted to each other by filled copper plating filled into the throughholes, was prepared.

In the same manner as in Example 1, two or more wiring layers were then formed on the core substrate to prepare a desired multilayer wiring board.

Example 9

The same core material as used in Example 1 was first provided, and throughholes were formed in the core material in the same manner as in Example 1.

Next, a 30 nm-thick electroconductive material diffusion barrier layer formed of titanium nitride was formed by MO-CVD on both sides of the core material and on the inner wall surface of the throughholes. A 1 μm-thick insulation layer of silicon dioxide was then formed by plasma CVD so as to cover the electroconductive material diffusion barrier layer.

A 200 nm-thick electroconductive base layer of copper was then formed on the insulation layer by vapor deposition. Thereafter, a photosensitive film resist (SUNFORT SPG152, manufactured by Asahi Kasei EMD Corporation) was laminated on both sides of the core material, followed by exposure in a predetermined pattern and development to form a resist film so that the throughholes were exposed.

Electroplating (average current density 1 A/dm$^2$) was then carried out for 5 hr with the same filled plating solution as in Example 2 using the electroconductive base layer as a seed layer to fully fill copper into the throughholes.

The resist film was then removed with CLEAN-THROUGH KS7405, manufactured by Kao Corp., and the exposed electroconductive base layer was removed with a sodium persulfate solution. Next, the excess copper film protruded from the core material was removed by polishing. Thus, a core substrate (a core substrate as shown in FIG. 1) of which the front side and back side have been electrically conducted to each other by the filled copper plating filled into the throughholes, was prepared.

Next, in the same manner as in Example 1, two or more wiring layers were formed on the core substrate to prepare a desired multilayer wiring board.

Comparative Example 1

The formation of a core substrate followed by the preparation of a multilayer wiring board was carried out in the same manner as in Example 2, except that the order of the formation of the electroconductive material diffusion barrier layer and the formation of the insulation layer was reversed.

Specifically, the core material having pores was subjected to thermal oxidation (1050° C., 20 min) to form an 800 nm-thick insulation layer on both sides of the core material and on the inner wall surface of the pores. Next, a 10 nm-thick electroconductive material diffusion barrier layer of titanium nitride was formed by MO-CVD on this insulation layer.

Comparative Example 2

The preparation of a core substrate followed by the preparation of a multilayer wiring board was carried out in the same manner as in Example 5, except that any second insulation layer was not formed.

Evaluation

The core substrates prepared in Examples 1 to 9 and Comparative Examples 1 and 2 were inspected for whether or not they were defective. The results are shown in Table 1.

(Criteria of Quality Evaluation)

○: The shape of the electroconductive material immediately after filling into the throughholes (pores) was identical to the opening pattern of the resist film, and any damage to the insulation layer and electroconductive material diffusion barrier layer on the core material was not observed after the removal of the excess electroconductive material protruded on the core material.

x: The electroconductive material filled into the throughholes (pores) entered the underside of the resist film, and, consequently, the shape of the electroconductive material formed on the core material face was different from the opening pattern of the resist film, resulting in the occurrence of damage to the insulation layer and electroconductive material diffusion barrier layer on the core material after the removal of the excess electroconductive material protruded on the core material.

Further, the multilayer wiring boards prepared in Examples 1 to 9 and Comparative Examples 1 and 2 were subjected to the following environmental test and were then inspected for wiring connection. The results were as shown in Table 1 below.

(Environmental Test)

The procedure consisting of allowing the multilayer wiring board to stand at −55° C. for 15 min and then allowing the multilayer wiring board to stand at 125° C. for 15 min was repeated by 1000 cycles.

TABLE 1

| Core substrate Multilayer wiring board | Evaluation of quality | Connection test |
|---|---|---|
| Example 1 | ○ | Abnormal connection not observed |
| Example 2 | ○ | Abnormal connection not observed |
| Example 3 | ○ | Abnormal connection not observed |
| Example 4 | ○ | Abnormal connection not observed |
| Example 5 | ○ | Abnormal connection not observed |
| Example 6 | ○ | Abnormal connection not observed |
| Example 7 | ○ | Abnormal connection not observed |
| Example 8 | ○ | Abnormal connection not observed |
| Example 9 | ○ | Abnormal connection not observed |
| Comparative Example 1 | x | Abnormal connection observed |
| Comparative Example 2 | x | Abnormal connection observed |

Industrial Applicability

As described above, the present invention is useful for the manufacture of various multilayer wiring board and electronic equipment and the like.

The invention claimed is:

1. A method for manufacturing a multilayer wiring board comprising a silicon core substrate and two or more wiring layers provided through an electrical insulating layer on the silicon core substrate, said method comprising the steps of:

subjecting a silicon core material for the silicon core substrate to dry etching utilizing plasma from one side of the silicon core material to form pores having an opening diameter in the range of 10 to 100 μm to a predetermined depth;

polishing the other side of the silicon core material to expose the pores and thus to form throughholes;

forming an insulation layer and an electroconductive material diffusion barrier layer at least on the inner wall surface of the throughholes so that the electronconductive material diffusion barrier layer is covered with the insulation layer;

filling an electroconductive material into the throughholes to bring the silicon core substrate to such a state that the front side and back side of the silicon core substrate have been electrically conducted to each other; and forming vias on the silicon core substrate so as to be connected to the electronconductive material filled into the throughholes and, at the same time, forming a first wiring layer through an electrical insulating layer, wherein the step of forming the insulation layer and the electroconductive material diffusion barrier layer, after the formation of the insulation layer and the electroconductive material diffusion barrier layer on the surface of the silicon core material including the inner wall surface of the throughholes so that the electroconductive material diffusion barrier layer is covered with the insulation layer, an electroconductive base layer is formed on at least a part of the insulation layer located on the inner wall surface of the throughholes, and, in the step of filling the electroconductive material into the throughholes, a desired resist film is formed on the silicon core material excluding the inside of the throughholes followed by electroplating to fill the electroconductive material into the throughholes.

2. The method according to claim 1, wherein the electroconductive base layer is formed by MO-CVD.

3. A method for manufacturing a multilayer wiring board comprising a core substrate and two or more wiring layers provided through an electrical insulating layer on the core substrate, said method comprising the steps of:

subjecting a core material for a core substrate to dry etching utilizing plasma from one side of the core material to form pores having an opening diameter in the range of 10 to 100 μm to a predetermined depth;

polishing the other side of the core material to expose the pores and thus to form throughholes;

forming an insulation layer and an electroconductive material diffusion barrier layer on both sides of the core material and the inner wall surface of the throughholes so that the electroconductive material diffusion barrier layer is covered with the insulation layer and then forming an electroconductive base layer on the whole area of one side of the core material;

forming a desired resist film on the electroconductive base layer and on a site of the insulation layer remote from the core material and filling an electroconductive material into the throughholes by electroplating using the electroconductive base layer as a seed layer so that the front side and back side of the core substrate have been electrically conducted to each other; and forming vias on the core substrate so as to be connected to the electroconductive material filled into the throughholes and, at the same time, forming a first wiring layer through an electrical insulating layer.

4. The method according to claim 3, wherein the electroconductive base layer is formed by either vapor deposition or sputtering.

5. The method according to claim 3 wherein the step of forming the insulation layer and the electroconductive material diffusion barrier layer, the insulation layer and the electroconductive material diffusion barrier layer are formed by any one of a method in which the electroconductive material diffusion barrier layer and the insulation layer are stacked in that order, a method in which two insulation layers as the insulation layer and the electroconductive material diffusion barrier layer are formed by stacking a first insulation layer, the electroconductive material diffusion barrier layer, and a second insulation layer in that order, and a method in which three insulation layers as the insulation layer and the electroconductive material diffusion barrier layer are formed by stacking a first insulation layer, a second insulation layer, the electroconductive material diffusion barrier layer, and a third insulation layer in that order, the first insulation layer is formed by thermal oxidation or plasma CVD, and the second insulation layer and the third insulation layer are formed by plasma CVD.

6. The method according to claim 1 or 3 wherein the electroconductive material diffusion barrier layer is formed by MO-CVD.

7. The method according to claim 1 or 3 wherein the pores are formed so as to have an opening diameter in the range of 10 to 70 μm.

8. The method according to claim 3 wherein the core material is made of silicon.

* * * * *